US009010907B2

(12) United States Patent
Koseki

(10) Patent No.: US 9,010,907 B2
(45) Date of Patent: *Apr. 21, 2015

(54) LIQUID JET HEAD, LIQUID JET APPARATUS, AND METHOD OF MANUFACTURING LIQUID JET HEAD

(71) Applicant: SII Printek Inc., Chiba (JP)

(72) Inventor: Osamu Koseki, Chiba (JP)

(73) Assignee: SII Printek Inc. (JP)

( * ) Notice: Subject to any disclaimer, the term of this patent is extended or adjusted under 35 U.S.C. 154(b) by 148 days.

This patent is subject to a terminal disclaimer.

(21) Appl. No.: 13/719,313

(22) Filed: Dec. 19, 2012

(65) Prior Publication Data

US 2013/0187986 A1    Jul. 25, 2013

(30) Foreign Application Priority Data

Dec. 26, 2011    (JP) .................................. 2011-284159

(51) Int. Cl.
| | |
|---|---|
| B41J 2/015 | (2006.01) |
| B41J 2/045 | (2006.01) |
| B41J 2/14 | (2006.01) |
| H01L 21/64 | (2006.01) |
| B41J 2/145 | (2006.01) |
| B41J 2/16 | (2006.01) |

(52) U.S. Cl.
CPC ............... B41J 2/1433 (2013.01); H01L 21/64 (2013.01); B41J 2/145 (2013.01); B41J 2/1631 (2013.01); B41J 2/1646 (2013.01); B41J 2/14209 (2013.01); B41J 2/1609 (2013.01); B41J 2202/11 (2013.01); B41J 2002/14491 (2013.01)

(58) Field of Classification Search
USPC .......................................................... 347/65
See application file for complete search history.

(56) References Cited

U.S. PATENT DOCUMENTS

| | | | |
|---|---|---|---|
| 6,582,066 B1 * | 6/2003 | Temple ............................ | 347/68 |
| 6,830,319 B2 * | 12/2004 | Harajiri et al. .................. | 347/68 |
| 6,959,471 B2 * | 11/2005 | Temple et al. ............... | 29/25.35 |
| 7,891,782 B2 * | 2/2011 | Owaki et al. .................... | 347/68 |

(Continued)

FOREIGN PATENT DOCUMENTS

| | | |
|---|---|---|
| EP | 2363291 | 9/2011 |
| GB | 2362609 | 11/2001 |

(Continued)

OTHER PUBLICATIONS

British IPO Search Report mailed Apr. 22, 2013 issued in GB Appln. No. GB1223302.9.

*Primary Examiner* — Stephen Meier
*Assistant Examiner* — Renee I Wilson
(74) *Attorney, Agent, or Firm* — Adams & Wilks

(57) ABSTRACT

A liquid jet head includes an actuator portion having a first recessed portion, second recessed portions, and left and right channel rows provided between the first and second recessed portions, respectively, and being offset in a row direction by ½ of a channel pitch. Each of the left and right channel rows includes channels each having one end portion opened to the first recessed portion and another end portion opened to one of the second recessed portions. The channels are formed of grooves each sandwiched by two of a series of walls extending from the first recessed portion to one of the second recessed portions. A width of the walls corresponding to one of the left and right channel rows being equal to a width of the grooves corresponding to the other of the left and right channel rows.

21 Claims, 15 Drawing Sheets

(56) References Cited

U.S. PATENT DOCUMENTS

| | | | |
|---|---|---|---|
| 2007/0070125 A1* | 3/2007 | Watanabe | 347/58 |
| 2007/0188564 A1 | 8/2007 | Harvey et al. | 347/85 |
| 2008/0036823 A1 | 2/2008 | Tanuma | 347/70 |
| 2009/0284569 A1 | 11/2009 | Kawaguchi et al. | 347/68 |
| 2010/0238237 A1* | 9/2010 | Seki | 347/71 |
| 2011/0242223 A1 | 10/2011 | Koseki | 347/50 |

FOREIGN PATENT DOCUMENTS

| | | |
|---|---|---|
| JP | 4658324 | 9/2002 |
| JP | 4263742 | 6/2007 |
| JP | 2009196122 | 9/2009 |
| JP | 2010069855 | 4/2010 |
| JP | 2011062866 | 3/2011 |
| WO | 0029217 | 5/2000 |
| WO | 2005007415 | 1/2005 |

* cited by examiner

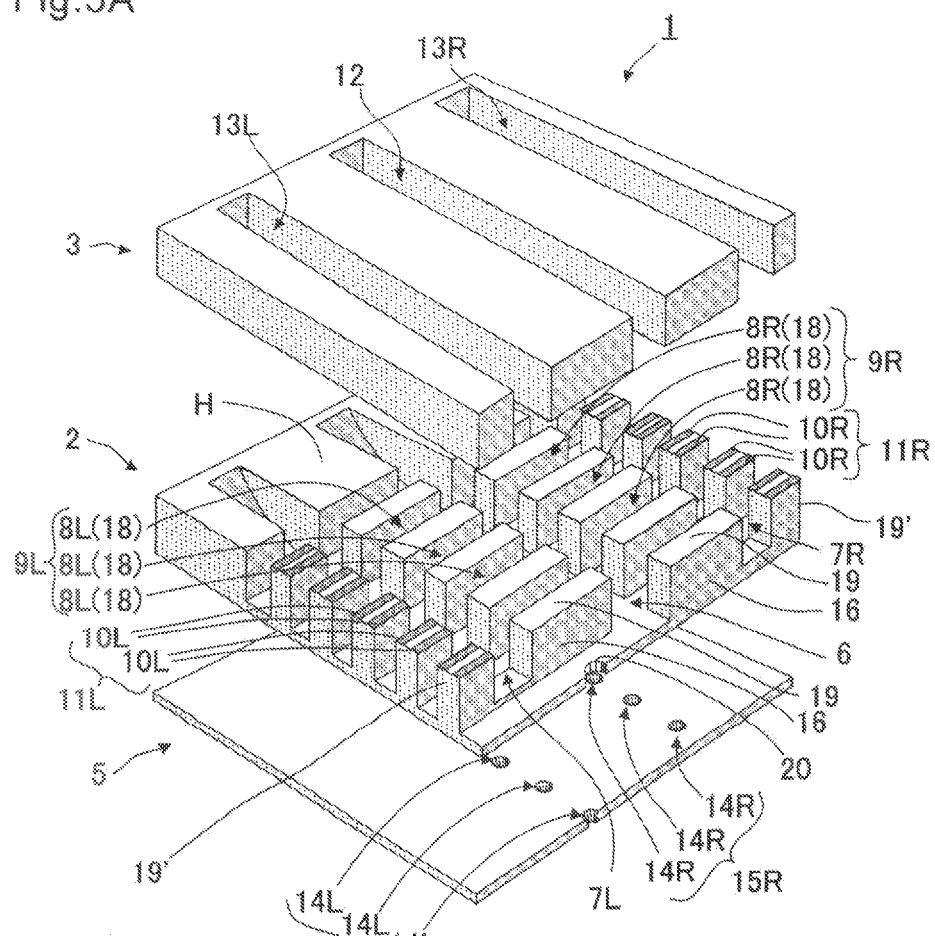
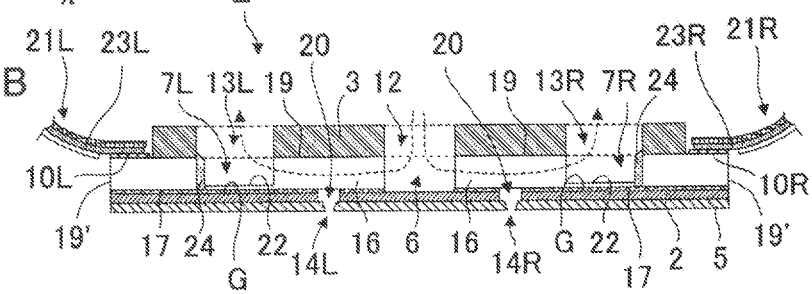
Fig.5A
Fig.5B

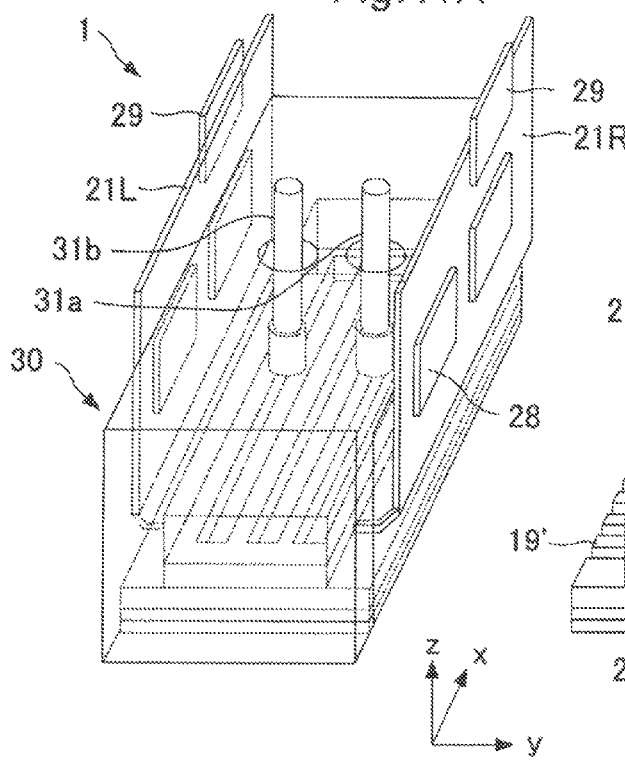
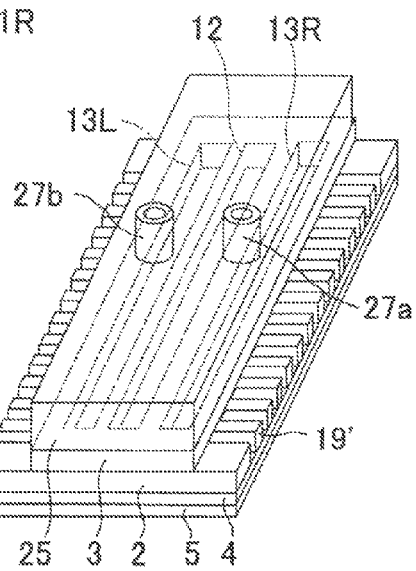
Fig. 11A  Fig. 11B
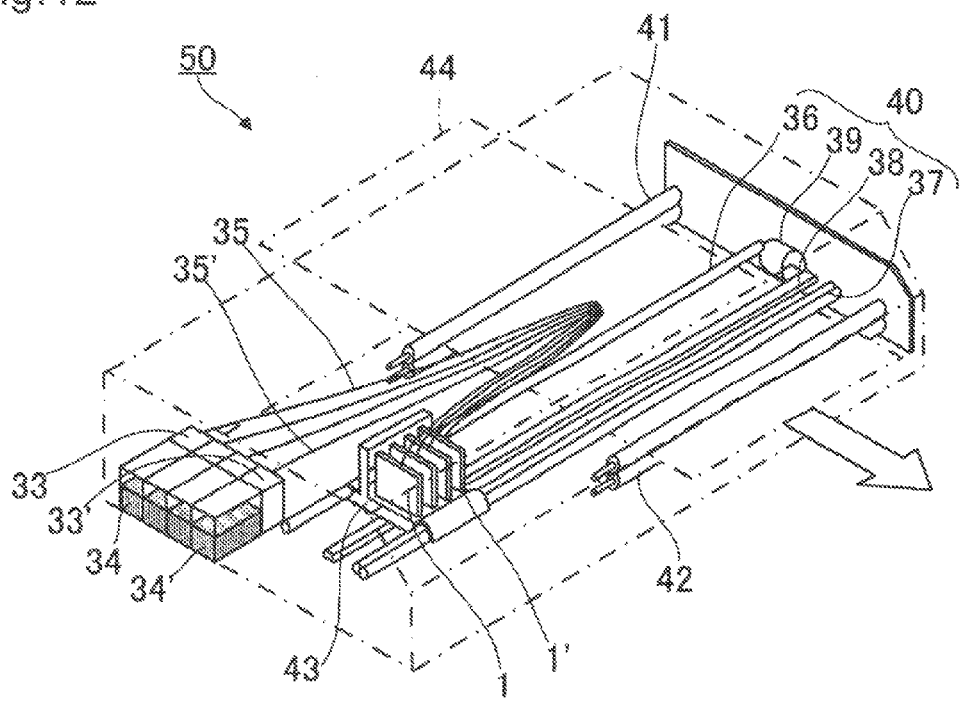
Fig. 12

(S4-1)

(S4-2)

(S4-3)

(S4-4)

(S5-1)

(S5-2)

LIQUID JET HEAD, LIQUID JET APPARATUS, AND METHOD OF MANUFACTURING LIQUID JET HEAD

BACKGROUND OF THE INVENTION

1. Field of the Invention

The present invention relates to a liquid jet head for ejecting liquid from a nozzle to record graphics and characters on a recording medium, or to form a functional thin film thereon. The present invention relates also to a liquid jet apparatus using the liquid jet head, and to a method of manufacturing a liquid jet head.

2. Description of the Related Art

In recent years, there has been used an ink-jet type liquid jet head for ejecting ink droplets on recording paper or the like to record characters or graphics thereon, or for ejecting a liquid material on a surface of an element substrate to form a functional thin film thereon. In such a liquid jet head, ink or a liquid material is supplied from a liquid tank via a supply tube to the liquid jet head, and ink or a liquid material filled into a channel is ejected from a nozzle which communicates with the channel. When ink is ejected, the liquid jet head or a recording medium on which a pattern of jetted liquid is to be recorded is moved to record characters or graphics, or to form a functional thin film in a predetermined shape.

Japanese Patent Application Laid-open No. 2009-196122 describes an ink jet head 60 in which ink channels which are a large number of grooves are formed in a sheet formed of a piezoelectric material. FIG. 20 is a sectional view of the ink jet head 60 illustrated in FIG. 2 of Japanese Patent Application Laid-open No. 2009-196122. The ink jet head 60 has a laminated structure of a substrate 62, a piezoelectric member 65, and a cover member 64. Supply ports 81 are formed in the middle of the substrate 62 and discharge ports 82 are formed so as to sandwich the supply ports 81. The piezoelectric member 65 and a frame member 63 are adhered to a front surface of the substrate 62, and the cover member 64 is adhered to an upper surface thereof.

The piezoelectric member 65 is formed by adhering together two piezoelectric plates 73 in which the directions of polarization are opposite to each other. A plurality of minute grooves which extend in a sub-scanning direction (in a direction in parallel with the drawing sheet) are formed by grinding in the piezoelectric member 65, and a plurality of pressure chambers 74 which are arranged at regular intervals in a main scanning direction (in a direction perpendicular to the drawing sheet) are formed. Each of the pressure chambers 74 (channels) is defined by a pair of adjacent walls 75. An electrode 76 is formed continuously on opposing side surfaces of the pair of walls 75 and a bottom portion therebetween, and further, is electrically connected to ICs 66 via electric wiring 77 formed on the front surface of the substrate 62. The cover member 64 is formed by adhering a film 92 and a reinforcing member 94 together via an adhesive. The cover member 64 is adhered to the piezoelectric member 65 and the frame member 63 under a state in which the reinforcing member 94 is on the piezoelectric member 65 side. Openings 96 and nozzles 72 which correspond to the pressure chambers 74 are formed in the reinforcing member 94 and in the film 92, respectively.

Ink is supplied from the supply ports 81 in the middle of the substrate 62, and flows to the plurality of pressure chambers 74 and then to an ink chamber 90 to be discharged from the discharge ports 82. When a drive pulse is applied from the ICs 66 via the electric wiring 77 to the electrode 76 on the pair of walls 75 sandwiching the pressure chamber 74, the pair of walls 75 undergo shear deformation and bend so as to be spaced away from each other, and then return to their initial positions to increase the pressure in the pressure chamber 74. Thus, an ink droplet is ejected from the corresponding nozzle 72.

In this case, each piezoelectric member 65 has a trapezoidal shape. An electrode is formed on an inclined surface of the trapezoidal shape, and the electrode on the inclined surface electrically connects the electric wiring 77 formed on the front surface of the substrate 62 and the electrode 76 formed on the side surface of the piezoelectric member 65. Further, a plurality of the supply ports 81 for ink supply and a plurality of the discharge ports 82 for ink discharge are formed in the substrate 62. Therefore, the electric wiring 77 is formed on the front surface of the substrate 62 in a route that can skirt those supply ports 81 and discharge ports 82. Japanese Patent Nos. 4658324 and 4263742 and Japanese Patent Application Laid-open Nos. 2010-69855 and 2011-62866 also describe ink jet heads having substantially similar structures. Note that, Japanese Patent Application Laid-open Nos. 2010-69855 and 2011-62866 each describe an ink jet head having two channel rows which are offset in a row direction by a half pitch.

In the ink jet head 60 described in Japanese Patent Application Laid-open No. 2009-196122, the piezoelectric member 65 adhered on the front surface of the substrate 62 needs to be subjected to ramping to form the trapezoidal shape. Further, it is necessary to form conductive films on the inclined surface of the trapezoidal shape, both the side surfaces of the piezoelectric members 65, and the front surface of the substrate 62. Then, it is necessary to electrically separate the conductive films on both the side surfaces to form the electrodes 76, and pattern the conductive film on the substrate 62 to form a large number of electric wirings 77. However, the piezoelectric members 65 are adhered onto the front surface of the substrate 62, and hence a large number of protrusions are present. Further, the conductive film to be processed is inclined. Therefore, a minute process by photolithography and etching is difficult. In Japanese Patent Application Laid-open No. 2009-196122, the electric wirings 77 are formed one by one by laser patterning, and the conductive film on the inclined surface of the piezoelectric member 65 is electrically separated for every inclined surface. Thus, the electrode is processed by a linear process, and hence positioning and the like are complicated and a long period of time is required. Further, the frame member 63 is provided after the electric wirings 77 are formed on the substrate 62, and hence manufacturing steps including positioning, adhering, and processing of the frame member 63, and planarizing of a front surface 94a of the frame member 63 and a front surface of the trapezoidal piezoelectric member 65 become extremely complicated.

Further, in the ink jet head 60 of Japanese Patent Application Laid-open No. 2009-196122, the electric wiring 77 is formed on the substrate 62 on a front surface 92a side which is the ink ejection side, and the IC 66 is mounted on the same side. The cover member 64 comes close to the recording medium, and hence the height of the IC 66 is limited. Further, the IC 66 and a control circuit (not shown) need to be electrically connected to each other by a flexible substrate or the like, but the height thereof is limited also in this case.

SUMMARY OF THE INVENTION

The present invention has been made in view of the above-mentioned problems, and has an object to provide a liquid jet head in which an electrode pattern can be easily processed, and the limitation on the height of an electrical connection portion with respect to a control circuit or the like is alleviated.

According to an exemplary embodiment of the present invention, there is provided a liquid jet head, including: an actuator portion including: a first recessed portion; left and right second recessed portions formed at a distance from the first recessed portion and provided so as to sandwich the first recessed portion therebetween; left and right channel rows provided between the first recessed portion and the left and right second recessed portions, respectively, the left and right channel rows each including a plurality of channels arrayed therein, the plurality of channels each having one end portion opened to the first recessed portion and another end portion opened to one of the left and right second recessed portions; and left and right electrode terminal rows provided on a front surface on outer peripheral sides with respect to the left and right second recessed portions, respectively, the left and right electrode terminal rows each including a plurality of electrode terminals for transmitting a drive signal to the left and right channel rows, respectively; a cover plate including a first liquid chamber communicated with the first recessed portion and left and right second liquid chambers communicated with the left and right second recessed portions, respectively, the cover plate being bonded to the actuator portion while exposing the left and right electrode terminal rows and covering the left and right channel rows; and a nozzle plate including left and right nozzle rows each of which is formed of a row of nozzles communicated with the channels of the left and right channel rows, the nozzle plate being bonded to the actuator portion on a side opposite to the cover plate, in which the left channel row and the right channel row are offset in a row direction by ½ of a channel pitch.

Further, the actuator portion is made of a piezoelectric material in parts between the first recessed portion and the left and right second recessed portions and made of an insulating material having a dielectric constant smaller than a dielectric constant of the piezoelectric material in parts on outer peripheral sides with respect to the left and right second recessed portions.

Further, the plurality of channels are formed of a plurality of grooves which are each sandwiched by two walls of a plurality of walls extending from the first recessed portion to one of the left and right second recessed portions. The left and right channel rows are each formed of an array of the plurality of grooves defined by the plurality of walls. Each of the plurality of walls has a side surface on which a drive electrode is provided.

Further, corresponding ones of the plurality of electrode terminals and the drive electrode are electrically connected to each other via a wiring electrode provided on a bottom portion of the one of the left and right second recessed portions.

Further, the one of the left and right second recessed portions has a bottom surface including a protrusion, which is continuous with corresponding ones of the plurality of walls and which remains when an upper part of the corresponding one of the plurality of walls is removed. The wiring electrode is formed on a side surface of the protrusion and the bottom surface between adjacent protrusions.

Further, the plurality of grooves are extended to reach outer peripheral end sides of the actuator portion with respect to the left and right second recessed portions.

Further, the liquid jet head further includes left and right flexible substrates bonded to the front surface of the actuator portion on end portion sides and electrically connected to the left and right electrode terminal rows, respectively.

Further, a longitudinal direction of the plurality of channels is orthogonal to the row direction of the channel rows.

Further, the left nozzle row and the right nozzle row are offset in the row direction by ½ of a nozzle pitch.

Further, the actuator portion has a laminated structure in which a piezoelectric material upwardly-polarized with respect to the front surface and a piezoelectric material downwardly-polarized with respect to the front surface are laminated.

Further, the plurality of channels are communicated with the nozzles via through holes, respectively.

Further, the actuator portion includes a base plate, and the through holes are formed in the base plate.

According to an exemplary embodiment of the present invention, there is provided a liquid jet apparatus, including: the above-mentioned liquid jet head; a moving mechanism for reciprocating the liquid jet head; a liquid supply tube for supplying liquid to the liquid jet head; and a liquid tank for supplying the liquid to the liquid supply tube.

According to an exemplary embodiment of the present invention, there is provided a method of manufacturing a liquid jet head, including: a through hole forming step of forming through holes in a base plate; an actuator portion forming step of forming an actuator portion including a piezoelectric material; a bonding step of bonding the actuator portion to the base plate; a groove forming step of forming a plurality of grooves and a plurality of walls defining the plurality of grooves, which are arranged in parallel on a side of the actuator portion opposite to the base plate, thereby forming left and right channel rows which are formed of the plurality of grooves arranged in parallel and which are distanced from each other and offset in a row direction by ½ of a channel pitch; a conductive film forming step of depositing a conducive material on the actuator portion, thereby forming a conductive film on upper surfaces and side surfaces of the plurality of walls and bottom surfaces of the plurality of grooves; a recessed portion forming step of grinding the plurality of walls in a direction intersecting a longitudinal direction of the plurality of grooves, thereby forming a first recessed portion communicated with the plurality of grooves and left and right second recessed portions so as to sandwich the first recessed portion via the left and right channel rows, respectively; an electrode forming step of patterning the conductive film, thereby forming drive electrodes on the side surfaces of the plurality of walls and forming electrode terminals on a front surface of the actuator portion; a cover plate bonding step of bonding, to the actuator portion, a cover plate including a first liquid chamber and left and right second liquid chambers under a state in which the first liquid chamber is communicated with the first recessed portion, the left and right second liquid chambers are communicated with the left and right second recessed portions, respectively, the electrode terminals are exposed, and the left and right channel rows are covered; a grinding step of grinding the base plate on a side opposite to the actuator portion; and a nozzle plate bonding step of bonding a nozzle plate to the base plate.

Further, the recessed portion forming step includes performing grinding to reach a bottom surface of each of the plurality of grooves when the first recessed portion is formed, and performing grinding of upper portions of the plurality of walls so as to leave the bottom surface of the each of the plurality of grooves when the left and right second recessed portions are formed.

Further, the actuator portion forming step includes laminating and bonding a piezoelectric material upwardly-polarized with respect to a substrate surface and a piezoelectric material downwardly-polarized with respect to the substrate surface.

Further, the actuator portion forming step includes forming the actuator portion by fitting a piezoelectric substrate made of the piezoelectric material in regions of an insulating substrate made of an insulating material having a dielectric constant smaller than a dielectric constant of the piezoelectric material, the regions becoming the left and right channel rows.

Further, the method of manufacturing a liquid jet head further includes, prior to the groove forming step, a photosensitive resin film providing step of providing a photosensitive resin film on a surface of the actuator portion on a side opposite to the base plate. The electrode forming step includes patterning of the conductive film by a lift off method of removing the photosensitive resin film.

Further, the groove forming step includes forming the plurality of grooves to have a depth reaching the base plate.

Further, the groove forming step includes forming the plurality of grooves so as to extend to reach outer peripheral end sides of the actuator portion with respect to the left and right second recessed portions.

Further, the method of manufacturing a liquid jet head further includes a flexible substrate bonding step of bonding a flexible substrate on the front surface of the actuator portion, thereby electrically connecting wiring electrodes formed on the flexible substrate and the electrode terminals.

According to the present invention, the liquid jet head has a laminated structure in which the nozzle plate, the base plate, the actuator portion, and the cover plate are laminated. The actuator portion includes the first recessed portion, the left and right second recessed portions formed at a distance from the first recessed portion and provided so as to sandwich the first recessed portion therebetween, the left and right channel rows provided between the first recessed portion and the left and right second recessed portions, respectively, the left and right channel rows each including the plurality of channels each having the one end portion opened to the first recessed portion and the another end portion opened to the left or right second recessed portion, and the left and right electrode terminal rows each provided on the front surface on the outer peripheral side with respect to the left or right second recessed portion, the left and right electrode terminal rows each including the plurality of electrode terminals for transmitting a drive signal to the left or right channel row.

The cover plate includes the first liquid chamber communicated with the first recessed portion and the left and right second liquid chambers communicated with the left and right second recessed portions, respectively. The cover plate is bonded to the actuator portion while exposing the left and right electrode terminal rows and covering the left and right channel rows. The nozzle plate includes the left and right nozzle rows each formed of a row of the nozzles communicated with the channels in the left or right channel row, and the nozzle plate is bonded to the actuator portion on the side opposite to the cover plate. The left channel row and the right channel row of the actuator portion are offset in the row direction by ½ of the channel pitch.

By this construction, the electrode terminals are provided on the side opposite to the liquid ejection surface, and hence it is unnecessary to provide a limitation on the height for connection with respect to an outside circuit. Further, the wiring electrodes can be formed by collective patterning, and hence the manufacturing method is facilitated

BRIEF DESCRIPTION OF THE DRAWINGS

In the accompanying drawings:

FIG. 5A is a schematic partial exploded perspective view of a liquid jet head according to a second embodiment of the present invention and FIG. 5B is a schematic sectional view thereof taken along a line corresponding to the line A-A of FIG. 2;

FIGS. 11A and 11B are schematic perspective views of a liquid jet head according to a fifth embodiment of the present invention;

FIG. 12 is a schematic perspective view of a liquid jet apparatus according to a sixth embodiment of the present invention;

DETAILED DESCRIPTION OF THE PREFERRED EMBODIMENTS (Liquid Jet Head)
(First Embodiment)

FIGS. 1 to 4 are explanatory views of a liquid jet head 1 according to a first embodiment of the present invention. FIG.

Figure 1:
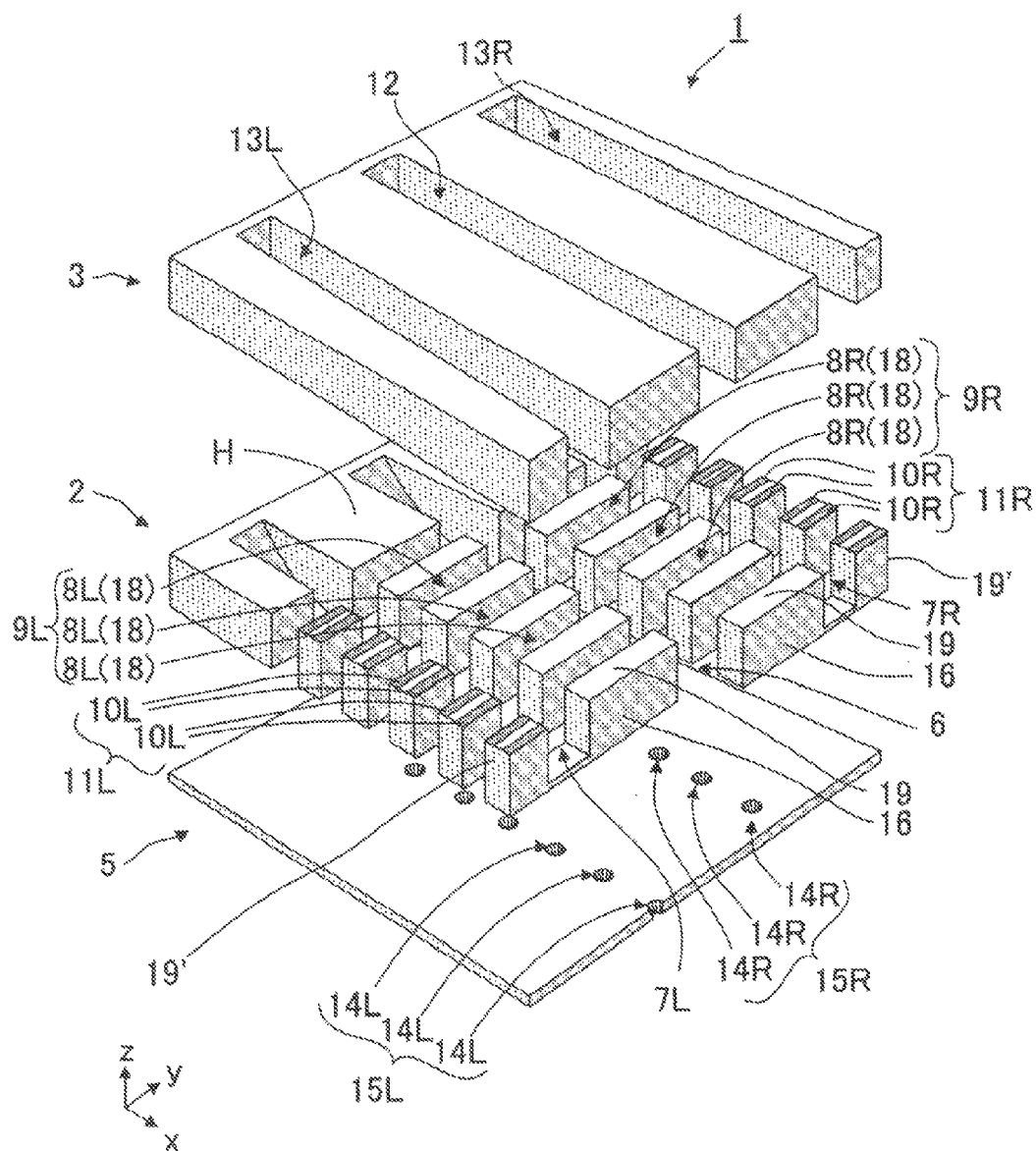
FIG. 1 is a schematic partial exploded perspective view of a liquid jet head according to a first embodiment of the present invention.
Figure 2:
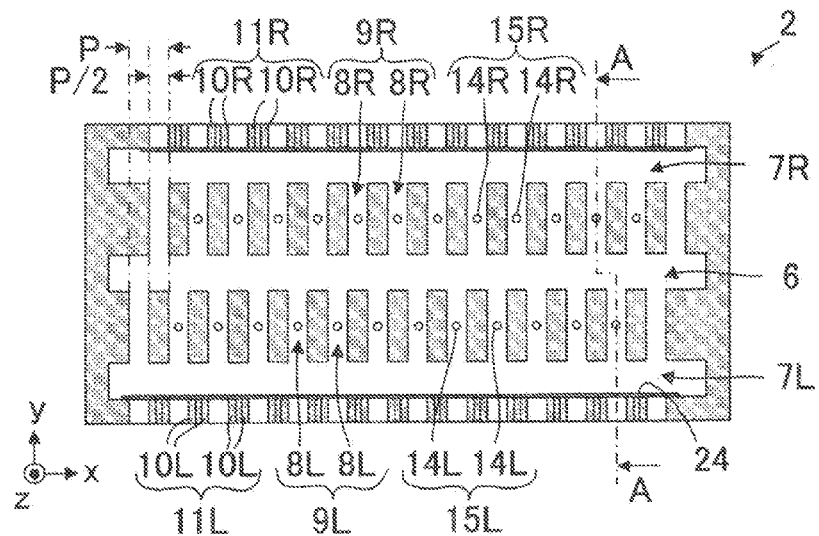
FIG. 2 is a schematic top view of the liquid jet head according to the first embodiment of the present invention from which a cover plate of the liquid jet head is removed.
Figure 3:
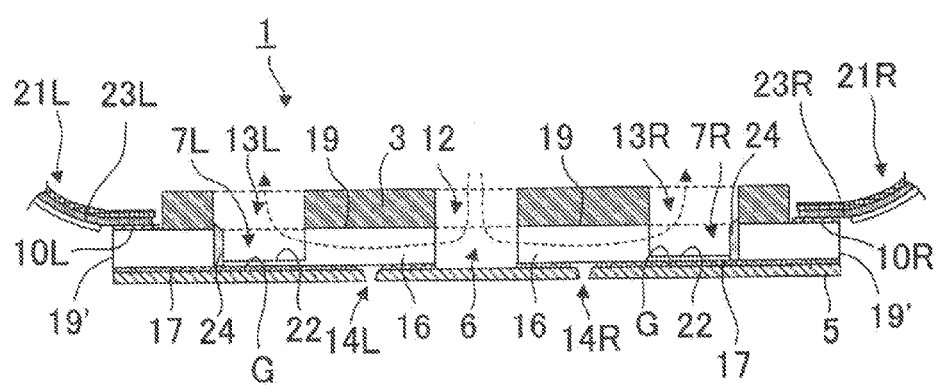
FIG. 3 is a schematic vertical sectional view taken along the line A-A of FIG. 2 in which left and right flexible substrates are additionally illustrated in the liquid jet head according to the first embodiment of the present invention.
Figure 4:
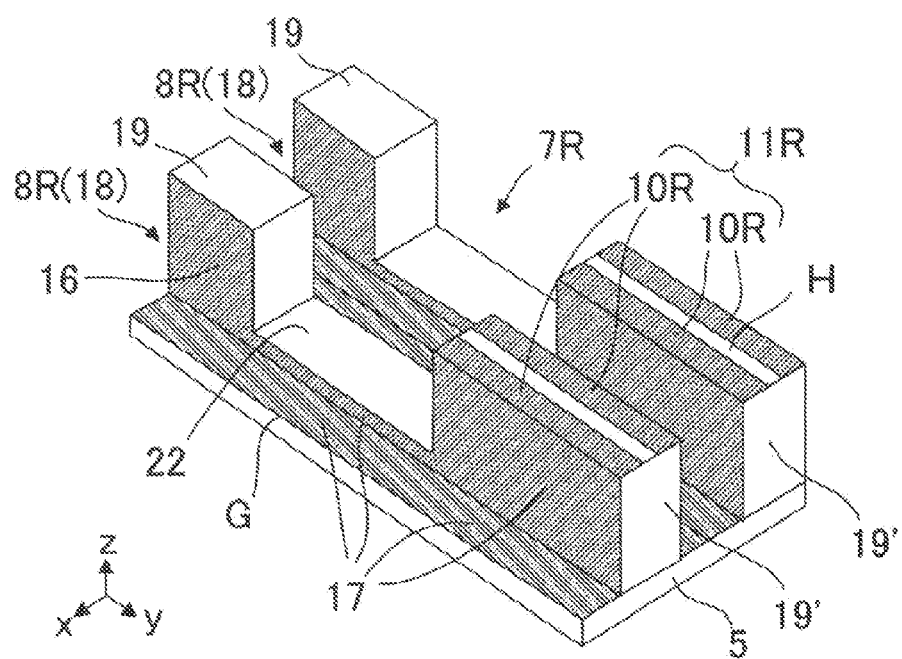
FIG. 4 is an explanatory diagram of wiring electrodes of the liquid jet head according to the first embodiment of the present invention.

1 is a schematic partial exploded perspective view of the liquid jet head 1, FIG. 2 is a schematic top view of the liquid jet head 1 from which a cover plate 3 is removed, FIG. 3 is a schematic vertical sectional view taken along the line A-A of FIG. 2 in which left and right flexible substrates 21L and 21R are additionally illustrated, and FIG. 4 is an explanatory diagram of wiring electrodes 17 and is a partial perspective view of a right end portion of the liquid jet head 1 from which the cover plate 3 is removed. In FIGS. 1 and 4, a sealing member 24 and flexible substrates 21 are omitted, and, in FIG. 2, the flexible substrates 21 are omitted. Note that, in the following description of embodiments, "left" and "right" refer to one side and the other side, respectively, with respect to a first recessed portion 6 or a first liquid chamber 12, and are not limited to left and right sides or left and right positions as seen from a specific angle.

As illustrated in FIGS. 1 to 3, the liquid jet head 1 includes an actuator portion 2 having left and right channels 8L and 8R for liquid droplet ejection formed therein, the cover plate 3 for closing openings on one side of each of the left and right channels 8L and 8R, and a nozzle plate 5 for liquid droplet ejection, which is bonded to the actuator portion 2.

The actuator portion 2 includes the first recessed portion 6, left and right second recessed portions 7L and 7R formed at a distance from the first recessed portion 6 so as to sandwich the first recessed portion 6 therebetween, a left channel row 9L provided between the first recessed portion 6 and the left second recessed portion 7L and including the plurality of left channels 8L each having one end portion opened to the first recessed portion 6 and the other end portion opened to the left second recessed portion 7L, and a right channel row 9R provided between the first recessed portion 6 and the right second recessed portion 7R and including the plurality of right channels 8R each having one end portion opened to the first recessed portion 6 and the other end portion opened to the right second recessed portion 7R.

As illustrated in FIG. 2, the left channel row 9L and the right channel row 9R are offset in a row direction (x direction) by a half pitch (P/2, where P is the channel pitch). The actuator portion 2 includes a left electrode terminal row 11L which is provided on a front surface H on an outer peripheral side with respect to the left second recessed portion 7L and which includes a plurality of left electrode terminals 10L for transmitting a drive signal to the left channel row 9L, and a right electrode terminal row 11R which is provided on the front surface H on an outer peripheral side with respect to the right second recessed portion 7R and which includes a plurality of right electrode terminals 10R for transmitting a drive signal to the right channel row 9R.

The actuator portion 2 may be made with use of a piezoelectric material subjected to polarization processing. Examples of the piezoelectric material to be used include lead zirconate titanate (PZT) ceramics. The actuator portion 2 may have a laminated structure in which a piezoelectric material polarized in an upward direction with respect to the front surface H (+z direction) and a piezoelectric material polarized in a downward direction with respect to the front surface H (−z direction) are laminated. The left channel 8L is formed of a groove 18 which is sandwiched by two walls 19 extending from the first recessed portion 6 to the left second recessed portion 7L. The left channel row 9L is formed of an array of the plurality of grooves 18 defined by the plurality of walls 19. The right channel 8R is formed of a groove 18 which is sandwiched by two walls 19 extending from the first recessed portion 6 to the right second recessed portion 7R. The right channel row 9R is formed of an array of the plurality of grooves 18 defined by the plurality of walls 19. Further, each of the grooves 18 forming the left and right channels 8L and 8R is extended up to the outer peripheral end sides of the actuator portion 2 with respect to the left and right second recessed portions 7L and 7R.

The drive electrode 16 is provided on the side surface of each of the walls 19 forming the left and right channels 8L and 8R. The left and right second recessed portions 7L and 7R are each formed of a region obtained by removing the plurality of walls 19 while leaving protrusions 22 unremoved, which are parts of the plurality of walls 19. Therefore, the side surface of the protrusion 22, the side surface of the wall 19, and the side surface of a wall 19' on the outer peripheral end side of the actuator portion 2 are continuous with one another. In the first recessed portion 6, all of the plurality of walls 19 are removed, and thus no protrusion 22 remains at its bottom surface. Each of the left channels 8L of the left channel row 9L is opened to the first recessed portion 6 and the left second recessed portion 7L. Similarly, each of the right channels 8R of the right channel row 9R is opened to the first recessed portion 6 and the right second recessed portion 7R.

The cover plate 3 includes the first liquid chamber 12 communicated with the first recessed portion 6, a left second liquid chamber 13L communicated with the left second recessed portion 7L, and a right second liquid chamber 13R communicated with the right second recessed portion 7R. The cover plate 3 is bonded to the front surface H of the actuator portion 2 while exposing the left electrode terminal row 11L and the right electrode terminal row 11R and covering the left channel row 9L and the right channel row 9R. It is preferred that the cover plate 3 have a coefficient of thermal expansion which is nearly equal to that of the actuator portion 2. For example, the cover plate 3 may be made with use of the same piezoelectric material as the actuator portion 2.

The nozzle plate 5 includes a left nozzle row 15L which is formed of a plurality of left nozzles 14L communicated with the left channels 8L, respectively, in the left channel row 9L, and a right nozzle row 15R which is formed of a plurality of right nozzles 14R communicated with the right channels 8R, respectively, in the right channel row 9R. The nozzle plate 5 is bonded to the actuator portion 2. As the nozzle plate 5, a polyimide film may be used. Alternatively, a ceramic material, a glass material, or other inorganic materials which have rigidity higher than that of the polyimide film may be used.

On the front surface H of the actuator portion 2 on the left outer peripheral end side, the left flexible substrate 21L is provided. Each left wiring 23L formed on the left flexible substrate 21L, and each left electrode terminal 10L are electrically connected to each other via an anisotropic conductive member (not shown). Similarly, on the front surface H of the actuator portion 2 on the right outer peripheral end side, the right flexible substrate 21R is provided. Each right wiring 23R formed on the right flexible substrate 21R, and each right electrode terminal 10R are electrically connected to each other via an anisotropic conductive member (not shown).

As illustrated in FIGS. 1 and 3, the protrusion 22 which is continuous with the wall 19 and the wall 19' remains on bottom surfaces G of the left and right second recessed portions 7L and 7R, that is, on an upper surface of the nozzle plate 5. This is for the purpose of, when the left and right second recessed portions 7L and 7R are formed, grinding the wall 19 so that the outer periphery of a dicing blade (also referred to as diamond wheel) does not reach the bottom surface G to prevent cutting of the conductive film deposited on the bottom surface G. As illustrated in FIG. 4, the right electrode terminal 10R formed on the upper end surface of the wall 19' and the drive electrode 16 formed on the side surface of the wall 19 of the right channel 8R are electrically connected to each other via a wiring electrode 17 formed on the bottom surface G of the groove 18 of the right channel 8R, a wiring electrode 17 formed on the bottom surface G of the right second recessed portion 7R, which is continuous with the bottom surface G of the groove 18, and the side surface of the protrusion 22, and a wiring electrode 17 formed on the bottom surface of the groove formed by the wall 19' of the outer peripheral portion and the side surface of the wall 19'. Similarly, the left electrode terminal 10L on the wall 19' and the drive electrode 16 formed on the side surface of the wall 19 of the left channel 8L are electrically connected to each other.

Further, as illustrated in FIG. 3, the sealing member 24 is provided to the left and right second recessed portions 7L and 7R on the outer peripheral sides of the actuator portion 2 to prevent liquid filled in the left and right channels 8L and 8R and in the left and right second recessed portions 7L and 7R from leaking to the outside. Note that, the position of the sealing member 24 is not limited to that illustrated in FIG. 3, and the sealing member 24 may be provided on the end portion sides of the cover plate 3.

The liquid jet head 1 is operated as follows. Liquid is supplied from a liquid tank (not shown) to the first liquid chamber 12 of the cover plate 3. Then, the liquid flows into the first recessed portion 6, and flows out from the first recessed portion 6 to fill the corresponding channels 8 of the left and right channel rows 9L and 9R. Further, the liquid flows out from the left second recessed portion 7L and the right second recessed portion 7R to the left second liquid chamber 13L and the right second liquid chamber 13R, respectively, and returns to the liquid tank (not shown). Next, when the drive signal is applied from a control circuit (not shown) to the electrode terminals 10L and 10R of the respective left and right electrode terminal rows 11L and 11R, the drive signal is transmitted to the drive electrode 16 of the corresponding channel 8 via the wiring electrode 17. When an electric field is applied to the wall 19 based on the drive signal, the wall 19 deforms. Thus, liquid droplets are ejected from the corresponding respective nozzles 14L and 14R.

As described above, the channel structure and the liquid flow are symmetrical, and hence it is possible to match the ejection condition of the liquid droplet ejected from the left nozzle row 15L and the ejection condition of the liquid droplet ejected from the right nozzle row 15R. Further, the groove 18 forming the channel is formed straightly from the first recessed portion 6 to the outer peripheral end of the actuator portion 2, and hence the liquid jet head 1 can be downsized without being affected by the outer shape of the dicing blade except for the first recessed portion 6. Further, the left and right electrode terminal rows 11L and 11R are provided on the front surface H of the actuator portion 2 on a side opposite to the side on which the liquid droplets are ejected. Therefore, there is no need to provide limitation on height for connection to the outside circuit, and the limitation on thickness of the left and right flexible substrates 21L and 21R and other elements, which are provided on the left and right electrode terminal rows 11L and 11R, is significantly alleviated.

It is noted that in this embodiment, the longitudinal direction of the left and right channels 8L and 8R (y direction), that is, the longitudinal direction of each groove 18 forming the channel 8 is orthogonal to the row direction of the left and right channel rows 9L and 9R (x direction). The left channel row 9L and the right channel row 9R are offset in the row direction by a half pitch (P/2). By providing the nozzles 14 at midpoints in the channels 8 in the longitudinal direction, the left nozzle row 15L and the right nozzle row 15R are offset in the row direction (x direction) by ½ of the nozzle pitch P. Therefore, by setting the scanning direction of the liquid jet head 1 to be the longitudinal direction of the channel 8 (y direction), a recording dot ejected from a right nozzle 14R in the right nozzle row 15R can be recorded at the midpoint between two recording dots recorded by being ejected from two left nozzles 14L in the left nozzle row 15L, and thus, the recording density can be improved so as to be doubled.

Further, in this embodiment, the actuator portion 2 is formed by laminating piezoelectric materials which are polarized in opposite directions, but the present invention is not limited to this structure of the actuator portion 2. It is possible that, in the actuator portion 2, the walls 19 between the first recessed portion 6 and the left and right second recessed portions 7L and 7R are formed of a piezoelectric material, and portions on the outer peripheral sides with respect to the left and right second recessed portions 7L and 7R are formed of an insulating material having a dielectric constant smaller than that of the piezoelectric material. With this configuration, it is possible to reduce the usage amount of the expensive piezoelectric material and reduce the manufacturing cost. Further, the wiring electrode and the electrode terminal row are not formed on the piezoelectric material, and hence the capacitance between the electrodes is reduced, and thus power consumption is significantly reduced. Note that, as the insulating material, a low-dielectric constant material such as machinable ceramics, alumina ceramics, and silicon dioxide may be used.

(Second Embodiment)

FIGS. 5A and 5B are explanatory views of a liquid jet head 1 according to a second embodiment of the present invention. FIG. 5A is a schematic partial exploded perspective view of the liquid jet head 1, and FIG. 5B is a schematic sectional view taken along a line corresponding to the line A-A of FIG. 2. The second embodiment is different from the first embodiment in that the actuator portion 2 remains at the bottom surface of the groove 18 forming the channel 8 and the bottom surfaces of the first recessed portion 6 and the left and right second recessed portions 7L and 7R, and the channel 8 is communicated with the nozzle 14 via a through hole 20 formed in the remaining actuator portion 2. Other configurations are the same as those in the first embodiment. The same parts or parts having the same functions are denoted by the same reference symbols.

The actuator portion 2 is ground so that the actuator portion 2 remains at the bottom portion of the groove 18. Then, the remaining actuator portion 2 is thinned by grinding from a rear surface side thereof, and the through hole 20 communicated with the channel 8 is formed by sandblasting and the like. As described above, by leaving the actuator portion 2 at the bottom portion of the groove 18, the wall 19 becomes stable when the first and second liquid chambers 12 and 13 are formed, which facilitates the manufacturing. Other points are similar to those in the first embodiment, and hence description thereof is omitted.

(Third Embodiment)

Figure 6:
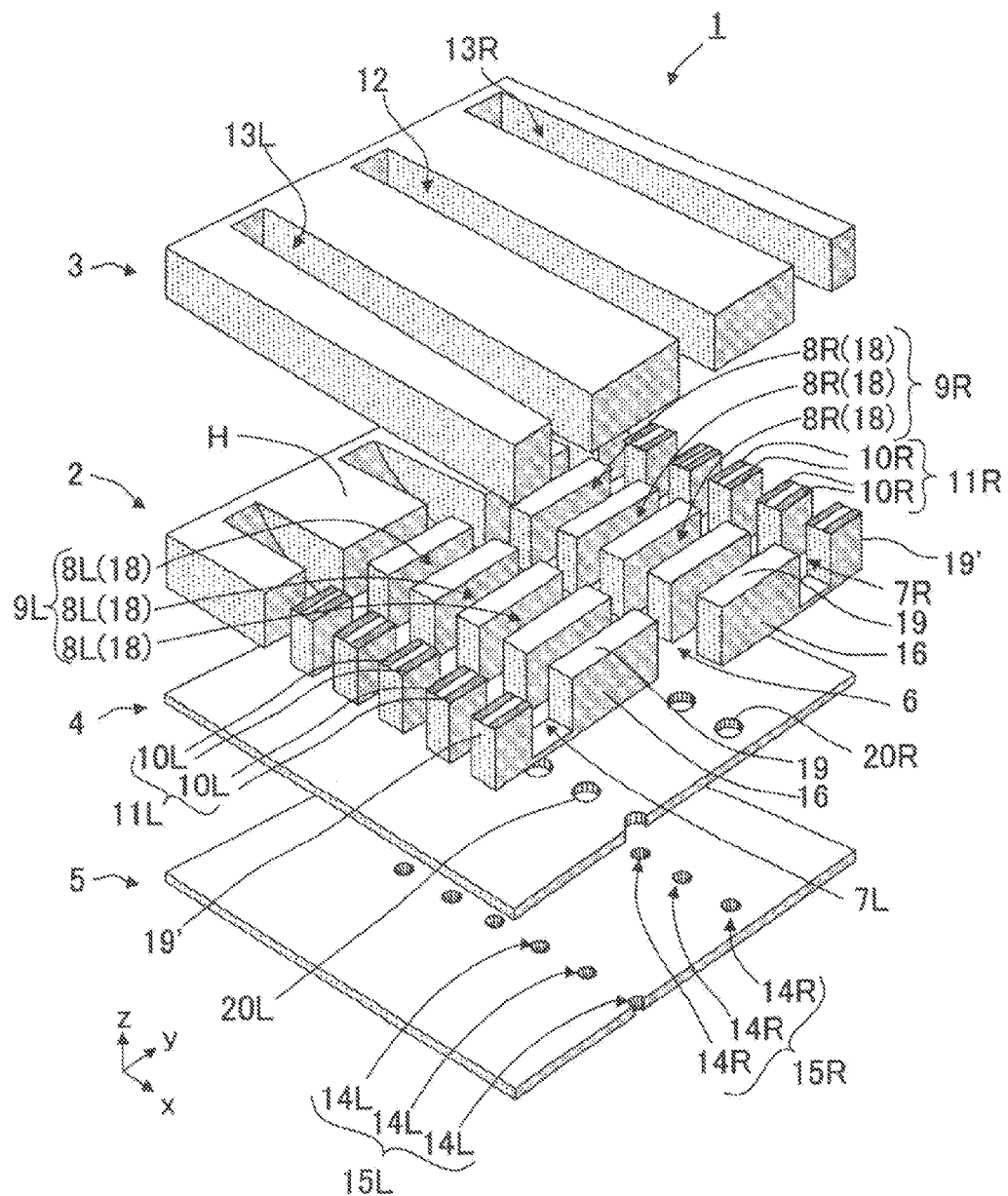
FIG. 6 is a schematic partial exploded perspective view of a liquid jet head according to a third embodiment of the present invention.
Figure 7:
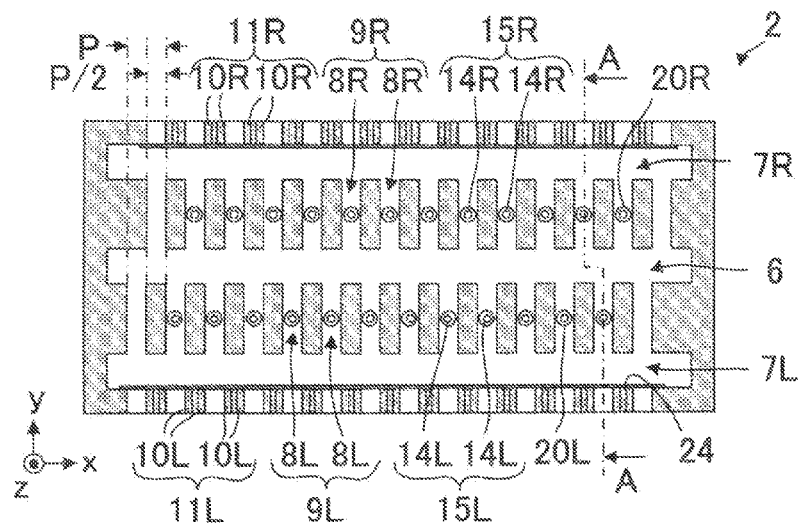
FIG. 7 is a schematic top view of the liquid jet head according to the third embodiment of the present invention from which a cover plate of the liquid jet head is removed.
Figure 8:
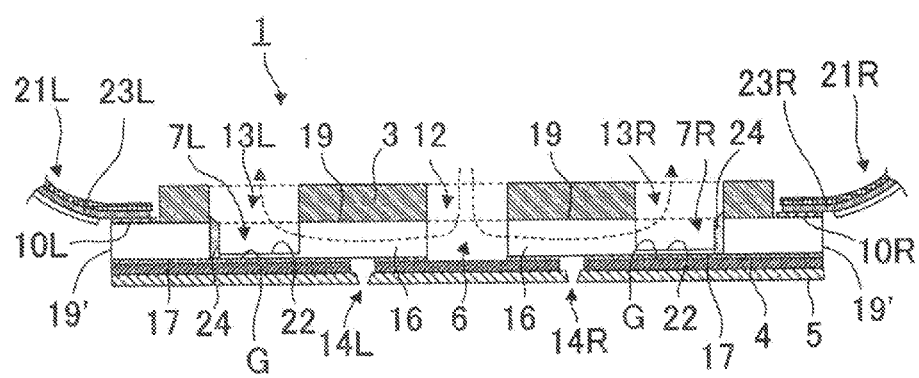
FIG. 8 is a schematic vertical sectional view taken along the line A-A of FIG. 7 in which left and right flexible substrates are additionally illustrated in the liquid jet head according to the third embodiment of the present invention.
Figure 9:
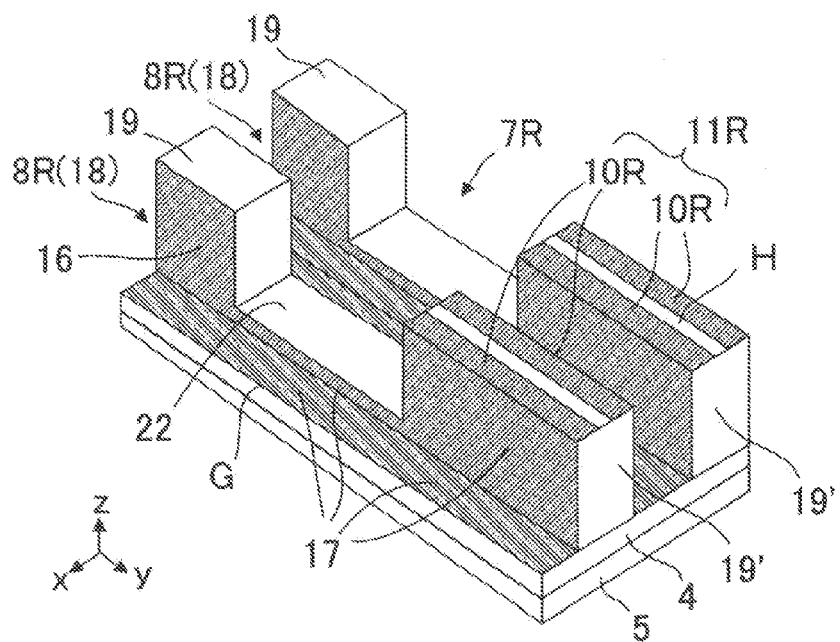
FIG. 9 is an explanatory diagram of wiring electrodes of the liquid jet head according to the third embodiment of the present invention.

FIGS. 6 to 9 are explanatory views of a liquid jet head 1 according to a third embodiment of the present invention. FIG. 6 is a schematic partial exploded perspective view of the liquid jet head 1, FIG. 7 is a schematic top view of the liquid jet head 1 from which the cover plate 3 is removed, FIG. 8 is a schematic vertical sectional view taken along the line A-A of FIG. 7 in which the left and right flexible substrates 21L and 21R are additionally illustrated, and FIG. 9 is an explanatory diagram of the wiring electrodes 17 and is a partial perspective view of the right end portion of the liquid jet head 1 from which the cover plate 3 is removed. In FIGS. 6 and 9, the sealing member 24 and the flexible substrates 21 are omitted, and, in FIG. 7, the flexible substrates 21 are omitted.

As illustrated in FIGS. 6 to 8, the liquid jet head 1 includes the actuator portion 2 having the left and right channels 8L and 8R for liquid droplet ejection formed therein, the cover plate 3 for closing openings on the one side of each of the left and right channels 8L and 8R, and the nozzle plate 5 for liquid droplet ejection, which is bonded to the base plate 4. The actuator portion 2 includes the base plate 4 on the nozzle plate 5 side which is on the side opposite to the cover plate 3 (note that, although the base plate 4 is included in the actuator portion 2, in the following description, for the sake of convenience, the portion except for the base plate 4 is referred to as the actuator portion 2, and the actuator portion 2 and the base plate 4 are regarded as different members.)

The actuator portion 2 includes the first recessed portion 6, left and right second recessed portions 7L and 7R formed at a distance from the first recessed portion 6 so as to sandwich the first recessed portion 6 therebetween, a left channel row 9L provided between the first recessed portion 6 and the left second recessed portion 7L and including the plurality of left channels 8L each having one end portion opened to the first recessed portion 6 and the other end portion opened to the left second recessed portion 7L, and a right channel row 9R provided between the first recessed portion 6 and the right second recessed portion 7R and including the plurality of right channels 8R each having one end portion opened to the first recessed portion 6 and the other end portion opened to the right second recessed portion 7R.

As illustrated in FIG. 7, the left channel row 9L and the right channel row 9R are offset in a row direction (x direction) by a half pitch (P/2, where P is the channel pitch). The actuator portion 2 includes a left electrode terminal row 11L which is provided on a front surface H on an outer peripheral side with respect to the left second recessed portion 7L and which includes a plurality of left electrode terminals 10L for transmitting a drive signal to the left channel row 9L, and a right electrode terminal row 11R which is provided on the front surface H on an outer peripheral side with respect to the right second recessed portion 7R and which includes a plurality of right electrode terminals 10R for transmitting a drive signal to the right channel row 9R.

The actuator portion 2 may be made with use of a piezoelectric material subjected to polarization processing. Examples of the piezoelectric material to be used include lead zirconate titanate (PZT) ceramics. The actuator portion 2 may have a laminated structure in which a piezoelectric material polarized in an upward direction with respect to the front surface H (+z direction) and a piezoelectric material polarized in a downward direction with respect to the front surface H (−z direction) are laminated. The left channel 8L is formed of a groove 18 which is sandwiched by two walls 19 extending from the first recessed portion 6 to the left second recessed portion 7L. The left channel row 9L is formed of an array of the plurality of grooves 18 defined by the plurality of walls 19. The right channel 8R is formed of a groove 18 which is sandwiched by two walls 19 extending from the first recessed portion 6 to the right second recessed portion 7R. The right channel row 9R is formed of an array of the plurality of grooves 18 defined by the plurality of walls 19. Further, each of the grooves 18 forming the left and right channels 8L and 8R is extended up to the outer peripheral end sides of the actuator portion 2 with respect to the left and right second recessed portions 7L and 7R.

The drive electrode 16 is provided on the side surface of each of the walls 19 forming the left and right channels 8L and 8R. The left and right second recessed portions 7L and 7R are each formed of a region obtained by removing the plurality of walls 19 while leaving protrusions 22 unremoved, which are parts of the plurality of walls 19. Therefore, the side surface of the protrusion 22, the side surface of the wall 19, and the side surface of a wall 19' on the outer peripheral end side of the actuator portion 2 are continuous with one another. In the first recessed portion 6, all of the plurality of walls 19 are removed, and thus no protrusion 22 remains at its bottom surface. Each of the left channels 8L of the left channel row 9L is opened to the first recessed portion 6 and the left second recessed portion 7L. Similarly, each of the right channels 8R of the right channel row 9R is opened to the first recessed portion 6 and the right second recessed portion 7R.

The cover plate 3 includes a first liquid chamber 12 communicated with the first recessed portion 6, a left second liquid chamber 13L communicated with the left second recessed portion 7L, and a right second liquid chamber 13R communicated with the right second recessed portion 7R. The cover plate 3 is bonded to the front surface H of the actuator portion 2 while exposing the left electrode terminal row 11L and the right electrode terminal row 11R and covering the left channel row 9L and the right channel row 9R. It is preferred that the cover plate 3 have a coefficient of thermal expansion which is nearly equal to that of the actuator portion 2. For example, the cover plate 3 may be made with use of the same piezoelectric material as the actuator portion 2.

The base plate 4 includes a plurality of through holes 20L communicated with the left channels 8L, respectively, in the left channel row 9L, and a plurality of through holes 20R communicated with the right channels 8R, respectively, in the right channel row 9R. The base plate 4 is bonded to the actuator portion 2 on a side opposite to the cover plate 3.

As a material for the base plate 4, there may be used ceramics such as machinable ceramics, PZT ceramics, silicon oxide, aluminum oxide (alumina), or aluminum nitride. Examples of the machinable ceramics include Macerite, Macor, Photoveel, and Shapal (which are all trademarks). In particular, the machinable ceramics can be easily ground, and has a coefficient of thermal expansion equivalent to that of the actuator portion 2. Therefore, the actuator portion 2 is not warped or cracked due to the temperature change, and thus the liquid jet head 1 with high reliability can be formed. In addition, when the machinable ceramics is used, because its dielectric constant is smaller than that of the piezoelectric material, a cross talk to be generated between the adjacent channels can be reduced.

The nozzle plate 5 includes a left nozzle row 15L which is formed of a plurality of left nozzles 14L communicated with the left channels 8L, respectively, in the left channel row 9L via the through holes 20L, and a right nozzle row 15R which is formed of a plurality of right nozzles 14R communicated with the right channels 8R, respectively, in the right channel row 9R via the through holes 20L. The nozzle plate 5 is bonded to the base plate 4. As the nozzle plate 5, a polyimide film may be used.

On the front surface H of the actuator portion 2 on the left outer peripheral end side, the left flexible substrate 21L is provided. Each left wiring 23L formed on the left flexible substrate 21L, and each left electrode terminal 10L are electrically connected to each other via an anisotropic conductive member (not shown). Similarly, on the front surface H of the actuator portion 2 on the right outer peripheral end side, the right flexible substrate 21R is provided. Each right wiring 23R formed on the right flexible substrate 21R, and each right electrode terminal 10R are electrically connected to each other via an anisotropic conductive member (not shown).

As illustrated in FIGS. 6 and 8, the protrusion 22 which is continuous with the wall 19 and the wall 19' remains on the bottom surfaces G of the left and right second recessed portions 7L and 7R. This is for the purpose of, when the left and right second recessed portions 7L and 7R are formed, grinding the wall 19 so that the outer periphery of a dicing blade (also referred to as diamond wheel) does not reach the bottom surface G to prevent cutting of the conductive film deposited on the bottom surface G. As illustrated in FIG. 9, the right electrode terminal 10R formed on the upper end surface of the wall 19' and the drive electrode 16 formed on the side surface of the wall 19 of the right channel 8R are electrically connected to each other via a wiring electrode 17 formed on the bottom surface G of the groove 18 of the right channel 8R, a wiring electrode 17 formed on the bottom surface G of the right second recessed portion 7R, which is continuous with the bottom surface G of the groove 18, and the side surface of the protrusion 22, and a wiring electrode 17 formed on the bottom surface of the groove formed by the wall 19' of the outer peripheral portion and the side surface of the wall 19'. Similarly, the left electrode terminal 10L on the wall 19' and the drive electrode 16 on the side surface of the wall 19 of the left channel 8L are electrically connected to each other.

Further, as illustrated in FIG. 8, the sealing member 24 is provided to the left and right second recessed portions 7L and 7R on the outer peripheral sides of the actuator portion 2 to prevent liquid filled in the left and right channels 8L and 8R and in the left and right second recessed portions 7L and 7R from leaking to the outside. Note that, the position of the sealing member 24 is not limited to that illustrated in FIG. 8, and the sealing member 24 may be provided on the end portion sides of the cover plate 3. The operation of the liquid jet head 1 is similar to that in the first embodiment, and hence description thereof is omitted.

As described above, the channel structure and the liquid flow are symmetrical, and hence it is possible to match the ejection condition of the liquid droplet ejected from the left nozzle row 15L and the ejection condition of the liquid droplet ejected from the right nozzle row 15R. Further, the groove 18 forming the channel is formed straightly from the first recessed portion 6 to the outer peripheral end of the actuator portion 2, and hence the liquid jet head 1 can be downsized without being affected by the outer shape of the dicing blade except for the first recessed portion 6. Further, the left and right electrode terminal rows 11L and 11R are provided on the front surface H of the actuator portion 2 on a side opposite to the side on which the liquid droplets are ejected. Therefore, there is no need to provide limitation on height for connection to the outside circuit, and the limitation on thickness of the left and right flexible substrates 21L and 21R and other elements, which are provided on the left and right electrode terminal rows 11L and 11R, is significantly alleviated.

It is noted that in this embodiment, the longitudinal direction of the left and right channels 8L and 8R (y direction), that is, the longitudinal direction of each groove 18 forming the channel 8 is orthogonal to the row direction of the left and right channel rows 9L and 9R (x direction). The left channel row 9L and the right channel row 9R are offset in the row direction by a half pitch (P/2). By providing the nozzles 14 at midpoints in the channels 8 in the longitudinal direction, the left nozzle row 15L and the right nozzle row 15R are offset in the row direction (x direction) by ½ of the nozzle pitch P. Therefore, by setting the scanning direction of the liquid jet head 1 to be the longitudinal direction of the channel 8 (y direction), a recording dot ejected from a right nozzle 14R in the right nozzle row 15R can be recorded at the midpoint between two recording dots recorded by being ejected from two left nozzles 14L in the left nozzle row 15L, and thus, the recording density can be improved so as to be doubled.

Further, in this embodiment, the actuator portion 2 is formed by laminating piezoelectric materials which are polarized in opposite directions, but the present invention is not limited to this structure of the actuator portion 2. It is possible that, in the actuator portion 2, the walls 19 between the first recessed portion 6 and the left and right second recessed portions 7L and 7R are formed of a piezoelectric material, and portions on the outer peripheral sides with respect to the left and right second recessed portions 7L and 7R are formed of an insulating material having a dielectric constant smaller than that of the piezoelectric material. With this configuration, it is possible to reduce the usage amount of the expensive piezoelectric material and reduce the manufacturing cost. Further, the wiring electrode and the electrode terminal row are not formed on the piezoelectric material, and hence the capacitance between the electrodes is reduced, and thus power consumption is significantly reduced. Note that, as the insulating material, a low-dielectric constant material such as machinable ceramics, alumina ceramics, and silicon dioxide may be used.

(Fourth Embodiment)

Figure 10:
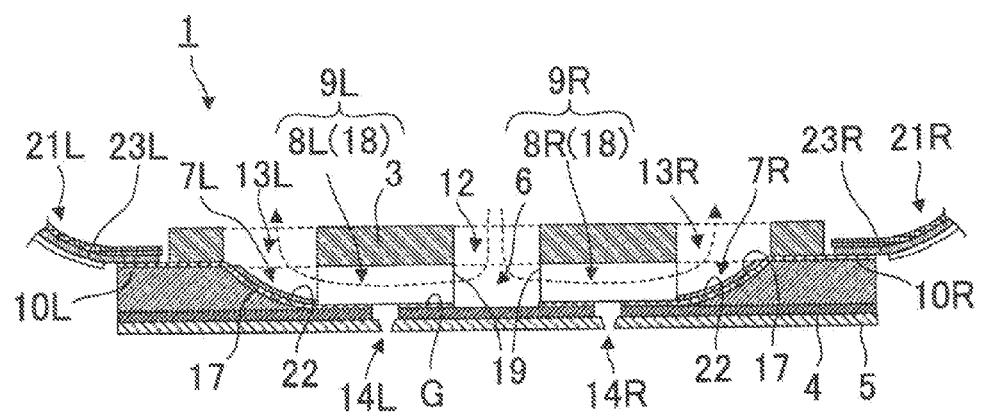
FIG. 10 is a schematic vertical sectional view of a liquid jet head according to a fourth embodiment of the present invention taken along a longitudinal direction of a channel.

FIG. 10 is a schematic vertical sectional view of a liquid jet head 1 according to a fourth embodiment of the present invention taken along a longitudinal direction of the channel 8 (corresponding to the line A-A of FIG. 7). The fourth embodiment is different from the third embodiment in that the bottom surface of each of the left and right second recessed portions 7L and 7R is formed into an arc shape. Other parts, including that the left channel row 9L and the right channel row 9R are offset in the row direction by P/2 (where P is the channel pitch), are similar to those in the third embodiment. In the following, description is made of the different parts. The same parts or parts having the same functions are denoted by the same reference symbols.

As illustrated in FIG. 10, the bottom portion of the left second recessed portion 7L includes an arc-like bottom surface continuous with the bottom surface G of the groove 18 of the left channel 8L, and the protrusion 22 protruding above the arc-like bottom surface. This arc shape is formed because the outer shape of the dicing blade is transferred when the left channel 8L is formed by the dicing blade. The bottom portion of the right channel 8R similarly includes an arc-like bottom surface and the protrusion 22 protruding above the arc-like bottom surface. An upper end of the protrusion 22 is illustrated as a smooth arc in FIG. 10, but actually, is formed into a step shape. The reason for that is the walls 19 are ground by scanning a plurality of times the dicing blade having a thickness smaller than the width of the left or right second recessed portion 7L or 7R in a direction orthogonal to the longitudinal direction of the groove 18 to form the left and right second recessed portions 7L and 7R.

The bottom portion of each of the left and right second recessed portions 7L and 7R has an inclination that becomes gradually shallower along the liquid flow. Therefore, liquid does not accumulate as compared to the case where the bottom portion has a rectangular shape as in the third embodiment. Thus, the flow of liquid from the channel 8 to the left or right second liquid chamber 13L or 13R is smooth. Therefore, cleaning of the inside of the liquid jet head and liquid replacement are facilitated. Further, the air bubbles mixed into the liquid are less likely to accumulate in the vicinity of the channel, and hence the ejection characteristics become stable. Note that, in the fourth embodiment, compared with the third embodiment, the sealing member 24 is not required to be provided, but the outer shape of the dicing blade is transferred to the bottom surfaces of the left and right second liquid chambers 13L and 13R, and thus, the width in the direction of the groove 18 is larger than that in the third embodiment. For example, when the depth of the grooves 18 is 350 μm, the width of the left and right second recessed portions 7L and 7R in the direction of the groove 18 is 4 mm to 6 mm.

(Fifth Embodiment)

FIGS. 11A and 11B are schematic perspective views of a liquid jet head 1 according to a fifth embodiment of the present invention. FIG. 11A is a perspective view of the entire liquid jet head 1, and FIG. 11B is a perspective view of the inside of the liquid jet head 1.

As illustrated in FIGS. 11A and 11B, the liquid jet head 1 has a laminated structure of the nozzle plate 5, the base plate 4, the actuator portion 2 including the plurality of walls 19', the cover plate 3, and a flow path member 25. The laminated structure of the nozzle plate 5, the base plate 4, the actuator portion 2, and the cover plate 3 are the same as that in the first or fourth embodiment. The nozzle plate 5, the base plate 4, and the actuator portion 2 each have a y-direction width which is larger than a y-direction width of each of the cover plate 3 and the flow path member 25. The cover plate 3 is bonded on the upper surface of the actuator portion 2 so that the walls 19' on both sides are exposed. The plurality of walls 19' on both sides are arrayed in parallel in the x direction. Left and right electrode terminal rows including a plurality of electrode terminals (not shown) are formed on the upper surfaces thereof. The cover plate 3 includes the first liquid chamber 12 communicated with the first recessed portion and the left and right second liquid chambers 13L and 13R communicated with the left and right second recessed portions.

The flow path member 25 includes a liquid supply chamber and a liquid discharge chamber (both not shown), which are formed of recessed portions opened in the surface on the cover plate 3 side, and includes a supply joint 27a communicated with the liquid supply chamber and a discharge joint 27b communicated with the liquid discharge chamber, which are formed on the surface of a side opposite to the cover plate 3. In the flow path member 25, the liquid supply chamber is communicated with the first liquid chamber 12, and the liquid discharge chamber is communicated with the left and right second liquid chambers.

The left and right flexible substrates 21L and 21R are bonded onto the upper surfaces of the walls 19' on both sides, respectively. A large number of wiring electrodes (not shown) are formed on the left and right flexible substrates 21L and 21R, and are electrically connected to the left and right electrode terminal rows (not shown) formed on the upper surfaces of the walls 19' on both sides. Each of the left and right flexible substrates 21L and 21R includes, on its surface, a driver IC 28 as a drive circuit and a connector 29. The driver IC 28 generates a drive signal for driving the channel 8 (not shown) based on a signal input from the connector 29, and supplies the generated drive signal to the drive electrode (not shown) via the left and right electrode terminal rows (not shown).

A base 30 houses the laminate of the nozzle plate 5, the base plate 4, the actuator portion 2, the cover plate 3, and the flow path member 25. A liquid jetting surface of the nozzle plate 5 is exposed at a lower surface of the base 30. The left and right flexible substrates 21L and 21R are pulled outside from both side surfaces of the base 30, and are fixed to both outer surfaces of the base 30. The base 30 includes two through holes in an upper surface thereof. A supply tube 31a for liquid supply is connected to the supply joint 27a while passing through one through hole, and a discharge tube 31b for liquid discharge is connected to the discharge joint 27b while passing through the other through hole.

The flow path member 25 is provided so as to supply liquid from an upper side and discharge the liquid to the upper side. Further, the driver IC 28 is mounted on each of the left and right flexible substrates 21L and 21R, and the left and right flexible substrates 21L and 21R are bent to be provided upright in a z direction. The left and right flexible substrates 21L and 21R are bonded to the upper surfaces of the walls 19' on the side opposite to the liquid ejection surface, and hence a space around the wiring can be sufficiently secured. Further, the driver IC 28 and the actuator portion 2 generate heat when being driven, but the heat is transferred to the liquid flowing inside via the base 30 and the flow path member 25. That is, with use of recording liquid for a recording medium as a cooling medium, the heat generated inside can be efficiently dissipated outside. Therefore, the driver IC 28 and the actuator portion 2 can be prevented from being lowered in driving ability due to overheating. Further, the liquid circulates inside the groove, and hence even when air bubbles are mixed, the air bubbles can be rapidly discharged to the outside. Thus, the liquid is not wasted, and it is also possible to suppress wasteful consumption of the recording medium due to recording failure. In this manner, it is possible to provide the liquid jet head 1 having high reliability.

(Liquid Jet Apparatus)

(Sixth Embodiment)

FIG. 12 is a schematic perspective view of a liquid jet apparatus 50 according to a sixth embodiment of the present invention. The liquid jet apparatus 50 includes a moving mechanism 40 for reciprocating liquid jet heads 1 and 1', flow path portions 35 and 35' for supplying liquid to the liquid jet heads 1 and 1' and collecting the liquid from the liquid jet heads 1 and 1', and liquid pumps 33 and 33' and liquid tanks 34 and 34' for circulating liquid to the flow path portions 35 and 35' and the liquid jet heads 1 and 1'. Each of the liquid jet heads 1 and 1' includes a plurality of ejection grooves, and a liquid droplet is ejected through a nozzle which communicates with each of the ejection grooves. As the liquid jet heads 1 and 1', any ones of the liquid jet heads of the first to fifth embodiments described above are used.

The liquid jet apparatus 50 includes a pair of conveyance means 41 and 42 for conveying a recording medium 44 such as paper in a main scanning direction, the liquid jet heads 1 and 1' for ejecting liquid toward the recording medium 44, a carriage unit 43 for mounting thereon the liquid jet heads 1 and 1', the liquid pumps 33 and 33' for pressurizing liquid stored in the liquid tanks 34 and 34' into the flow path portions 35 and 35' for circulation, and the moving mechanism 40 for causing the liquid jet heads 1 and 1' to scan in a sub-scanning direction which is orthogonal to the main scanning direction. A control portion (not shown) controls and drives the liquid jet heads 1 and 1', the moving mechanism 40, and the conveyance means 41 and 42.

Each of the pair of conveyance means 41 and 42 includes a grid roller and a pinch roller which extend in the sub-scanning direction and which rotate with roller surfaces thereof being in contact with each other. A motor (not shown) axially rotates the grid rollers and the pinch rollers to convey in the main scanning direction the recording medium 44 sandwiched therebetween. The moving mechanism 40 includes a pair of guide rails 36 and 37 which extend in the sub-scanning direction, the carriage unit 43 which is slidable along the pair of guide rails 36 and 37, an endless belt 38 which is coupled to the carriage unit 43 for moving the carriage unit 43 in the sub-scanning direction, and a motor 39 for rotating the endless belt 38 via a pulley (not shown).

The carriage unit 43 has the plurality of liquid jet heads 1 and 1' mounted thereon for ejecting, for example, four kinds of liquid droplets: yellow; magenta; cyan; and black. The liquid tanks 34 and 34' store liquid of corresponding colors, and circulate the liquid via the liquid pumps 33 and 33' and the flow path portions 35 and 35' to the liquid jet heads 1 and 1'. The respective liquid jet heads 1 and 1' eject liquid droplets of the respective colors in accordance with a drive signal. Through control of ejection timings of liquid from the liquid jet heads 1 and 1', rotation of the motor 39 for driving the carriage unit 43, and conveyance speed of the recording medium 44, an arbitrary pattern may be recorded on the recording medium 44.

(Method of Manufacturing Liquid Jet Head)

(Seventh Embodiment)

Figure 13:
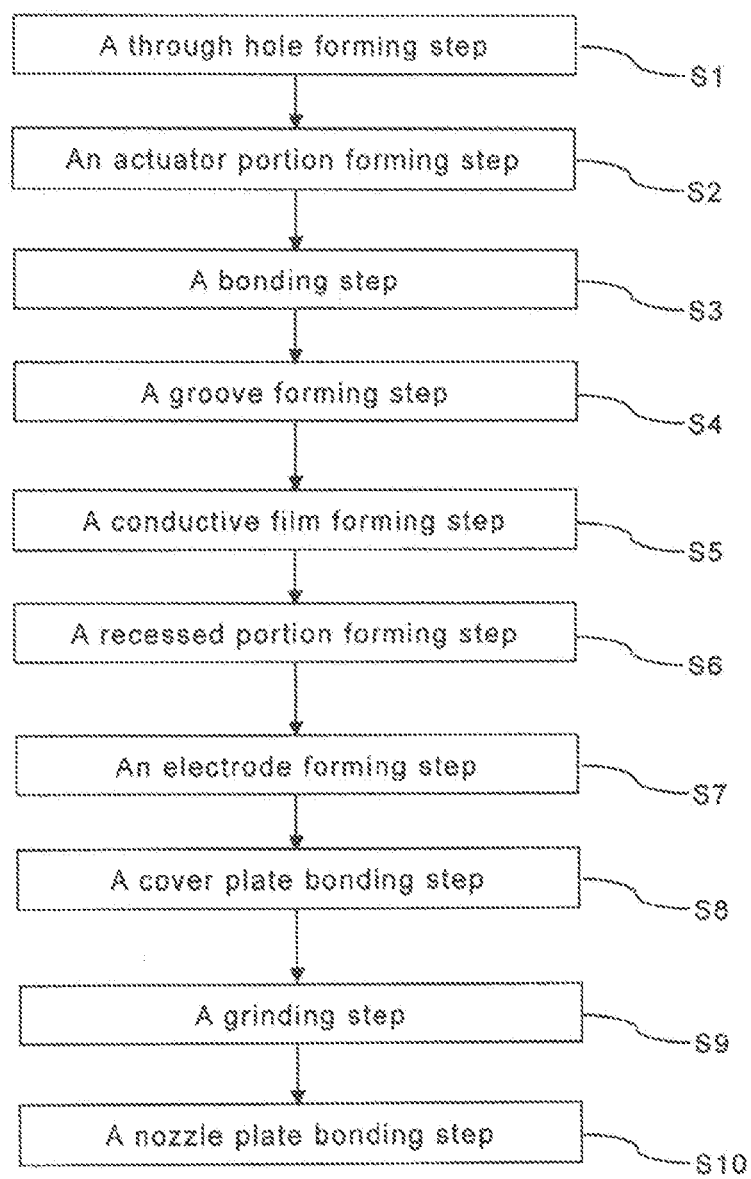
FIG. 13 is a process flow chart illustrating a basic method of manufacturing a liquid jet head according to a seventh embodiment of the present invention.

Next, a method of manufacturing a liquid jet head according to a seventh embodiment of the present invention is described. FIG. 13 is a process flow chart illustrating a basic method of manufacturing the liquid jet head 1 according to the present invention. FIGS. 14 to 18 are explanatory views illustrating respective steps.

Figure 14:
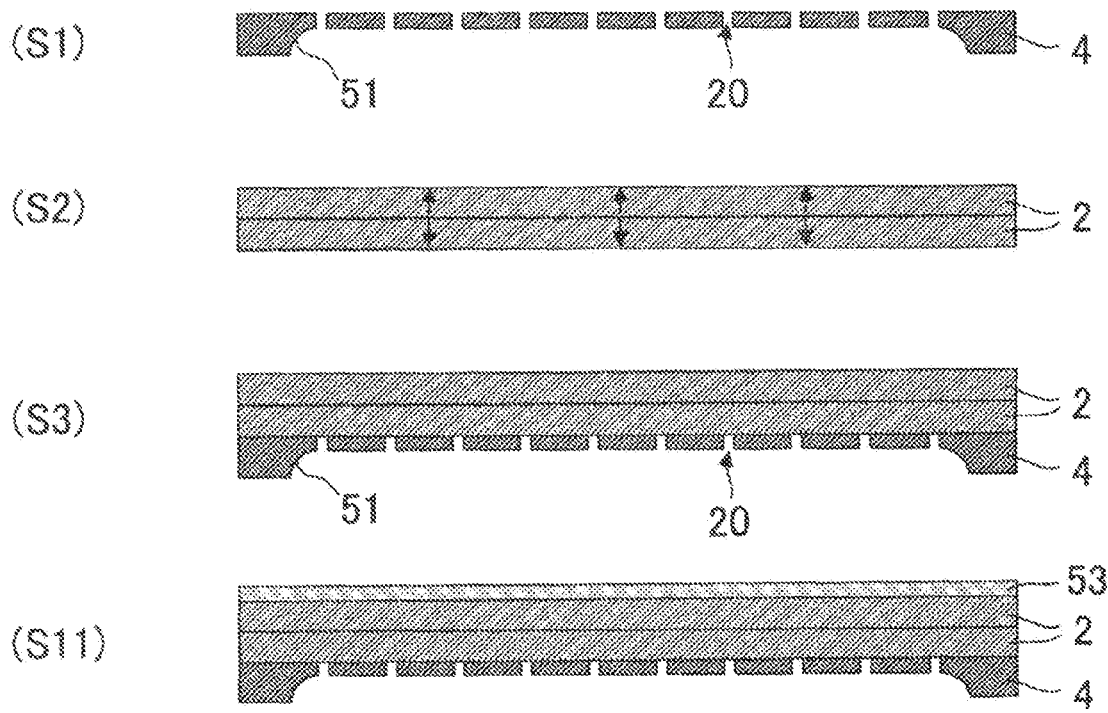
FIG. 14 is an explanatory view illustrating respective steps of the method of manufacturing a liquid jet head according to the seventh embodiment of the present invention.

First, in a through hole forming step S1, the through holes 20 are formed in the base plate 4. The through holes 20 are formed at positions where nozzles are provided, that is, positions where nozzles in the left and right nozzle rows are provided, in the same number as the number of nozzles. A spot facing portion 51 is formed in one surface of the base plate 4, and the through holes 20 passing through the base plate 4 to reach the bottom surface of the spot facing portion 51 are formed from the other surface of the base plate 4. Part (S1) of FIG. 14 is a schematic sectional view of a region of the base plate 4 in which the through holes 20 are formed. The spot facing portion 51 is provided for facilitating the perforation of the through holes 20. When a ceramic plate is used as the base plate 4, it is extremely difficult to perform highly-accurate positioning and form, in the ceramic plate, a large number of thin holes each having a diameter of several tens to hundreds of micrometers and a depth of 200 μm or more. Therefore, the spot facing portion 51 is formed in advance as follows. For example, a ceramic plate having a thickness of about 0.2 mm to 1 mm is prepared, and the ceramic plate is subjected to sandblasting at a position corresponding to the through holes 20 so that the bottom thickness remains by 0.1 mm to 0.2 mm.

As the base plate 4, there may be used a material such as machinable ceramics, PZT ceramics, silicon oxide, aluminum oxide, or aluminum nitride. Examples of the machinable ceramics include Macerite, Macor, Photoveel, and Shapal (which are all trademarks).

Next, in an actuator portion forming step S2, as illustrated in part (S2) of FIG. 14, the actuator portion 2 is formed by adhering together two piezoelectric materials subjected to polarization processing in directions opposite to each other, that is, an upward direction and a downward direction with respect to the plate surface. A PZT ceramics may be used as the piezoelectric material.

Next, in a bonding step S3, as illustrated in part (S3) of FIG. 14, the actuator portion 2 is bonded to the base plate 4 with an adhesive. An excess adhesive is pushed out from the through holes 20 when the actuator portion 2 and the base plate 4 are adhered together, and hence the through holes 20 contribute to obtaining uniform thickness of the adhesive.

Next, in a photosensitive resin film providing step S11 (omitted in FIG. 13.), as illustrated in part (S11) of FIG. 14, a photosensitive resin film 53 is provided on the surface of the actuator portion 2 on a side opposite to the base plate 4 side. As the photosensitive resin film 53, a resist film is adhered, and next, by photolithography, exposure and development are performed to form a pattern of the resist film. The pattern of the resist film is a pattern for mainly forming the left and right electrode terminal rows, and the resist film is removed from the region in which the electrode terminal rows are formed. As compared to a case where the pattern is formed by line drawing using laser light, a highly-accurate pattern can be formed in a short period of time. Note that, instead of adhering the resist film, resist liquid can be applied and dried as the resist film. Further, the photosensitive resin film providing step S11 is only required to be carried out after the bonding step S3 and before a conductive film forming step S5.

Next, in a groove forming step S4, the plurality of grooves 18 and the walls 19 defining the grooves 18 are formed, which are arranged in parallel to each other on the surface of the actuator portion 2 on the side opposite to the base plate 4 to form the left and right channel rows 9L and 9R, which are formed of the plurality of grooves 18 arranged in parallel and which are distanced from each other and offset by ½ of the channel pitch P. Part (S4-1) of FIG. 15 is a schematic vertical sectional view in the row direction of the right channel row 9R, part (S4-2) of FIG. 15 is a schematic vertical sectional view in the longitudinal direction of the right channel 8R, part (S4-3) of FIG. 15 is a top view of the actuator portion 2, and part (S4-4) of FIG. 15 is a schematic vertical sectional view taken along the line B-B of part (S4-3) of FIG. 15.

Figure 15:
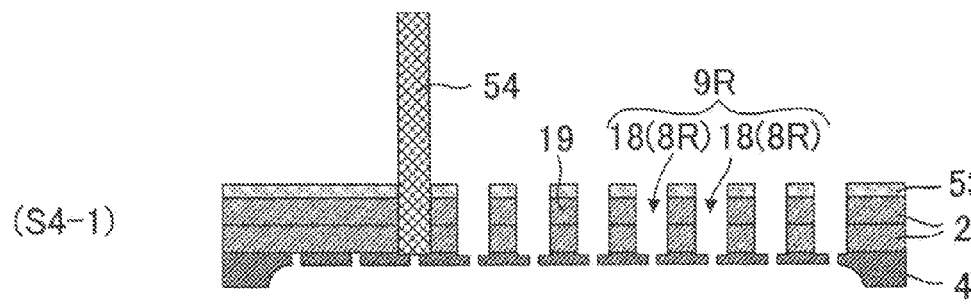
FIG. 15 is an explanatory view illustrating respective steps of the method of manufacturing a liquid jet head according to the seventh embodiment of the present invention.
Figure 15:
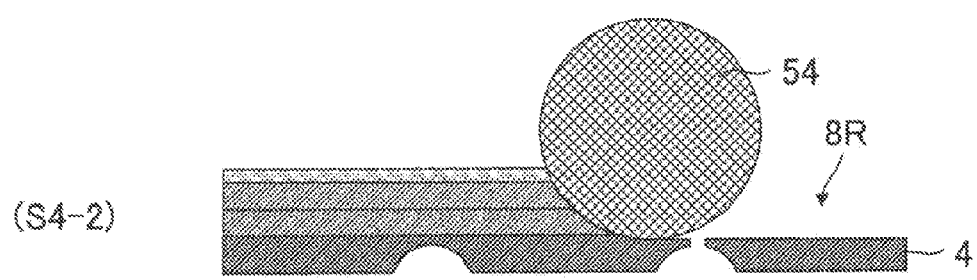
Figure 15:
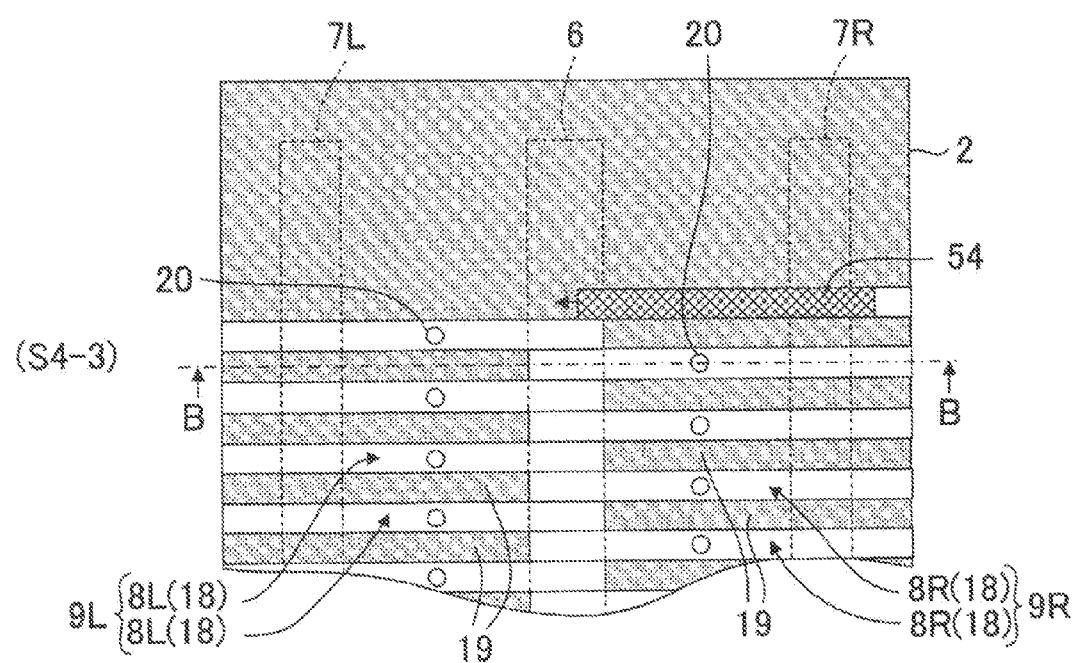
Figure 15:
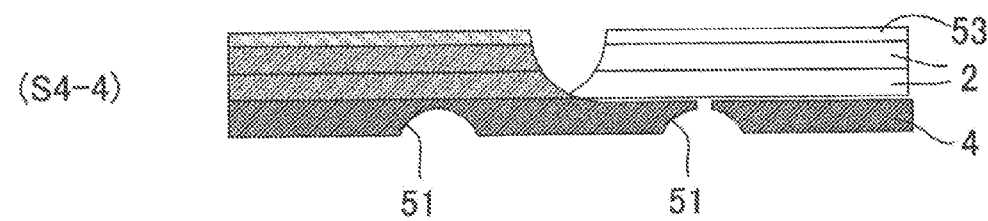

As illustrated in part (S4-3) of FIG. 15, the left channel row 9L including the plurality of left channels 8L is formed between a region in which the first recessed portion 6 is to be formed and a region in which the left second recessed portion 7L is to be formed, and the right channel row 9R including the plurality of right channels 8R is formed between the region in which the first recessed portion 6 is to be formed and a region in which the right second recessed portion 7R is to be formed. Here, the right channel row 9R and the left channel row 9L are offset in the row direction by ½ of the channel pitch P, and are formed by grinding by a dicing blade 54 alternately from the first recessed portion 6 to a left end portion of the actuator portion 2 and from the first recessed portion 6 to a right end portion of the actuator portion 2. The dicing blade 54 has a disc shape. Therefore, as illustrated in part (S4-4) of FIG. 15, the outer shape of the dicing blade 54 is transferred to the region of the first recessed portion 6. When the width of the wall 19 is smaller than the width of the groove 18, bottom surfaces in an arc shape which are symmetrical are alternately formed in the region to be the first recessed portion 6, and, when the width of the wall 19 is larger than the width of the groove 18, bottom surfaces in an arc shape which are symmetrical are alternately formed in the region to be the first recessed portion 6 and a thin wall remains between the symmetrical bottom surfaces. When the depth of the grooves 18 is 350 μm, the width of the first recessed portion 6 is 4 mm to 6 mm. The width of the groove 18 or the wall 19 is 50 μm to 100 μm.

Grinding may be performed so that the material of the actuator portion 2 remains at the bottom portion of the groove 18, but it is preferred that grinding be performed so that the bottom portion of the groove 18 reaches the base plate 4. In a case where the base plate 4 is made of a material having a dielectric constant smaller than that of the piezoelectric material, when grinding is performed so that the high-dielectric constant piezoelectric material does not remain at the bottom portion of the groove 18, a cross talk between the adjacent channels can be reduced. The through holes 20 are opened in the middle of the bottom surface of the left and right channels 8L and 8R, respectively. The spot facing portions 51 are formed in the base plate 4 in which the through holes 20 are formed.

It is noted that in this embodiment, the grooves 18 are extended from the first recessed portion 6 beyond the left second recessed portion 7L to the one outer peripheral end of the actuator portion 2 and are extended from the first recessed portion 6 beyond the right second recessed portion 7R to the other outer peripheral end of the actuator portion 2, but instead, as in the fourth embodiment, the grooves 18 may be formed from the first recessed portion 6 to the region to be the left second recessed portion 7L and from the first recessed portion 6 to the region to be the right second recessed portion 7R. In this case, the outer shape of the dicing blade 54 is transferred to the left and right second recessed portions 7L and 7R, and thus, the width of the liquid jet head 1 in the longitudinal direction of the grooves 18 becomes larger.

Next, in the conductive film forming step S5, a conductive material is deposited on the actuator portion 2, and a conductive film 55 is formed on the upper portions and the side surfaces of the plurality of walls 19 and the bottom surfaces of the grooves 18. In part (S5-1) of FIG. 16, because the photosensitive resin film 53 is formed in advance, the conductive film 55 is formed also on the upper surface of the photosensitive resin film 53. The conductive film 55 is formed by depositing a metal such as aluminum, nickel, chromium, copper, gold, and silver by sputtering, vapor deposition, plating, or the like.

Figure 16:
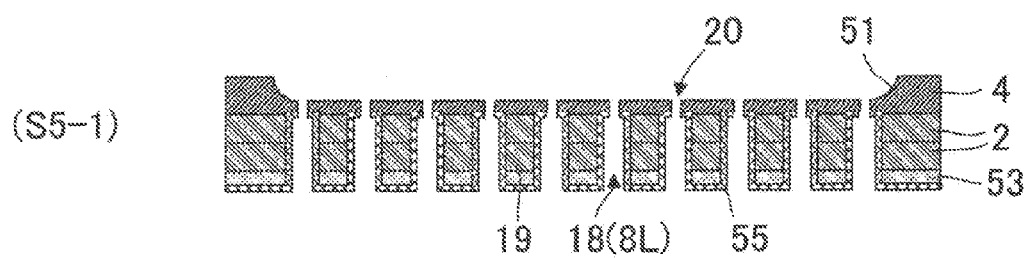
FIG. 16 is an explanatory view illustrating respective steps of the method of manufacturing a liquid jet head according to the seventh embodiment of the present invention.
Figure 16:
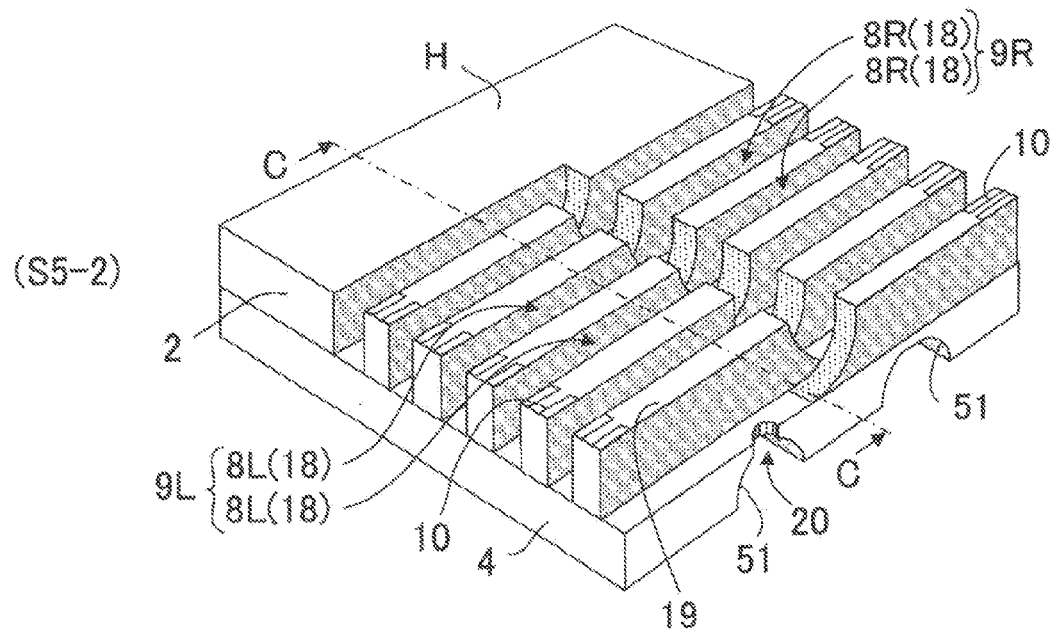

Part (S5-2) of FIG. 16 is a schematic partial perspective view of the laminate including the base plate 4 and the actuator portion 2, and the conductive film 55 is deposited on the exposed surface. Part (S5-1) of FIG. 16 is a schematic sectional view taken along the line C-C of part (S5-2) of FIG. 16 but vertically flipped. The left and right channel rows 9L and 9R in which the channels 8 are arrayed are formed in the actuator portion 2. The conductive film 55 is deposited on the entire upper surface of the actuator portion 2, the entire side surfaces of the walls 19, and the entire bottom surfaces of the grooves 18. In the front surface H at both end portions of the walls 19, the photosensitive resin film 53 is removed in regions in which the electrode terminals are to be formed. The conductive film 55 in the region in which the photosensitive resin film 53 is removed is electrically connected to the conductive film 55 on the flat bottom surface of the groove 18 via the conductive film 55 deposited on the side surfaces of the wall 19. Note that, the spot facing portions 51 are formed in the base plate 4 on the side opposite to the actuator portion 2 in regions in which the through holes 20 are formed.

Figure 17:
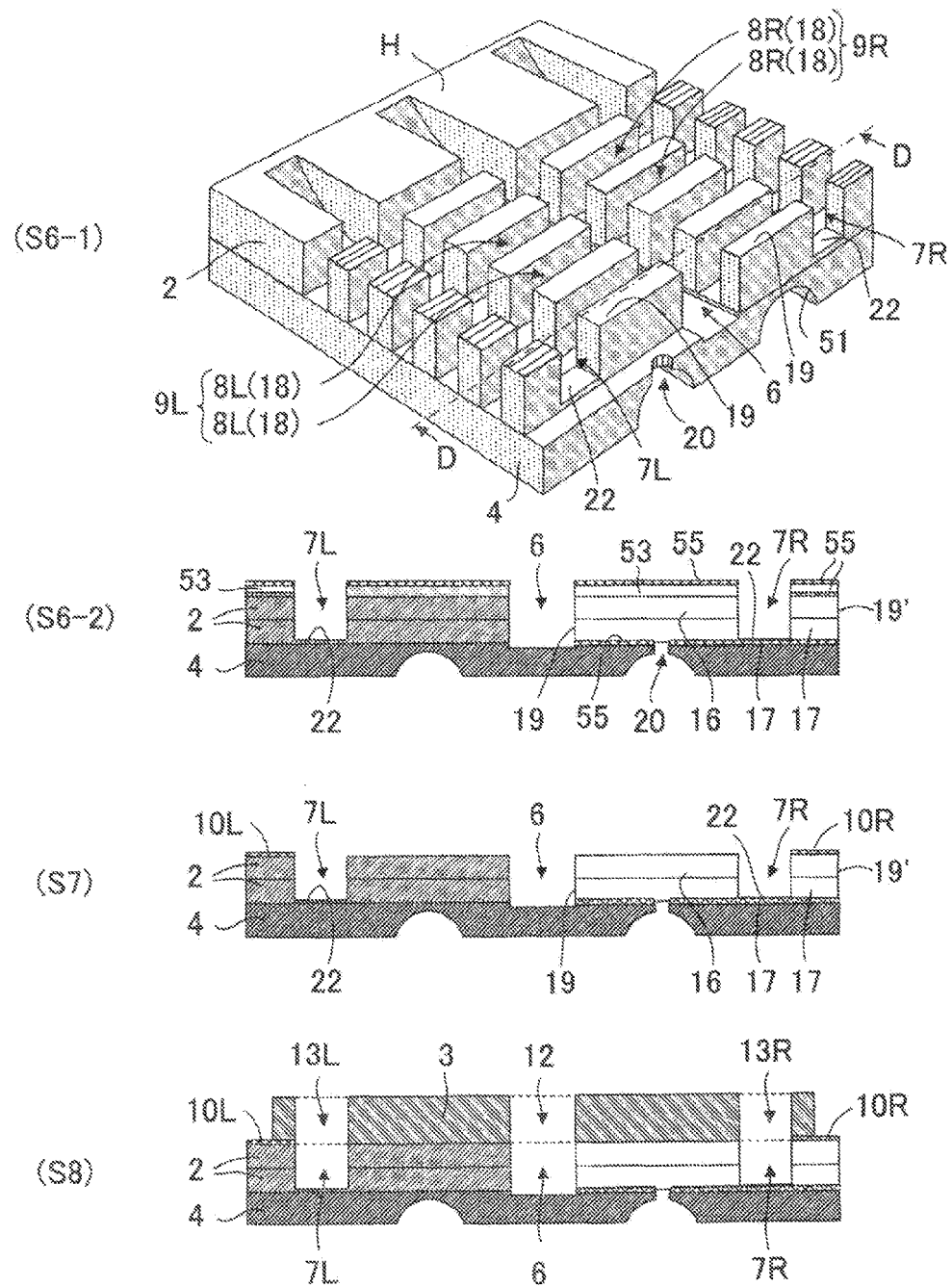
FIG. 17 is an explanatory view illustrating respective steps of the method of manufacturing a liquid jet head according to the seventh embodiment of the present invention.

Next, in a recessed portion forming step S6, the plurality of walls 19 are ground in a direction orthogonal to the longitudinal direction of the groove 18, thereby forming the first recessed portion 6 communicated with the plurality of grooves 18 and the left and right second recessed portions 7L and 7R so as to sandwich the first recessed portion 6 via the left and right channel rows 9L and 9R, respectively. Part (S6-1) of FIG. 17 is a schematic partial perspective view of the laminate including the actuator portion 2 and the base plate 4 after the first recessed portion 6 and the left and right second recessed portions 7L and 7R are formed, and part (S6-2) of FIG. 17 is a schematic vertical sectional view taken along the line D-D of part (S6-1) of FIG. 17. The dicing blade is used to carry out scanning and grinding in the direction orthogonal to the longitudinal direction of the groove 18. At the time of grinding the left and right second recessed portions 7L and 7R, in order to prevent cutting of the conductive film 55 deposited on the bottom surface of the groove 18, the wall 19 is ground in a manner that the outer periphery of the dicing blade does not reach the bottom surface. Therefore, the protrusions 22 protruding from the bottom surfaces of the left and right second recessed portions 7L and 7R are formed.

When the first recessed portion 6 is ground, the grinding is carried out in a manner that the outer periphery of the dicing blade reaches the base plate 4. This completely divides the conductive film 55 deposited on the side surfaces of the walls 19 and the arc-like bottom surfaces of the grooves 18 between the left and right regions.

Next, in an electrode forming step S7, as illustrated in part (S7) of FIG. 17, the conductive film 55 is patterned to form the drive electrode 16 on the side surface of the wall 19, and form the left and right electrode terminals 10L and 10R on the front surface H of the actuator portion 2. Through removal of the photosensitive resin film 53, the conductive film 55 is patterned (called lift off method). In other words, the photosensitive resin film 53 is removed, and thus the conductive film 55 deposited on the photosensitive resin film 53 is removed, thereby patterning the conductive film 55 on both side surfaces of the wall 19 and the conductive film 55 on the front surface H. As a result, the left and right electrode terminals 10L and 10R are formed on the front surface H of the actuator portion 2, and the drive electrodes 16 electrically separated from each other are formed on both the side surfaces of the wall 19. The drive electrode 16 on the side surface of the wall 19 and the left or right electrode terminal 10L or 10R are electrically connected to each other via the wiring electrode 17 formed on the bottom surface of the left or right second recessed portion 7L or 7R, the side surface of the protrusion 22, and the side surface of the wall 19'.

Next, in a cover plate bonding step S8, as illustrated in part (S8) of FIG. 17, the cover plate 3 including the first liquid chamber 12 and the left and right second liquid chambers 13L and 13R is bonded to the actuator portion 2 under a state in which the first liquid chamber 12 is communicated with the first recessed portion 6 and the left and right second liquid chambers 13L and 13R are communicated with the left and right second recessed portions 7L and 7R, respectively, the left and right electrode terminals 10L and 10R are exposed, and the left and right channel rows 9L and 9R (not shown) are covered. It is preferred that the cover plate 3 be made with use of a material having a coefficient of thermal expansion which is nearly equal to that of the actuator portion 2. For example, when a PZT ceramics is used for the actuator portion 2, the cover plate 3 can be made using the same PZT ceramics. The cover plate 3 has a function of closing the upper end openings of the respective grooves 18 to form the channels 8 as well as a function of uniformly supplying liquid to the first recessed portion 6 and uniformly discharging the liquid from the left and right second recessed portions 7L and 7R.

Figure 18:
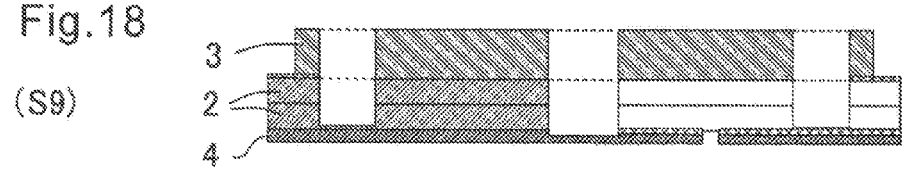
FIG. 18 is an explanatory view illustrating respective steps of the method of manufacturing a liquid jet head according to the seventh embodiment of the present invention.
Figure 18:
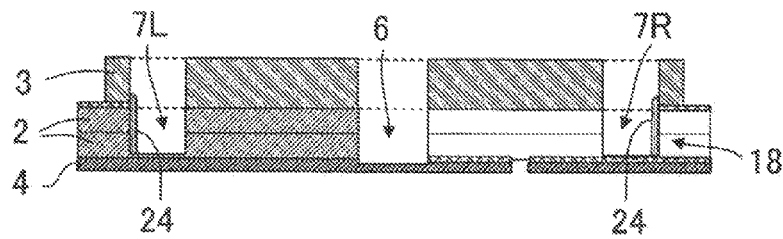
Figure 18:
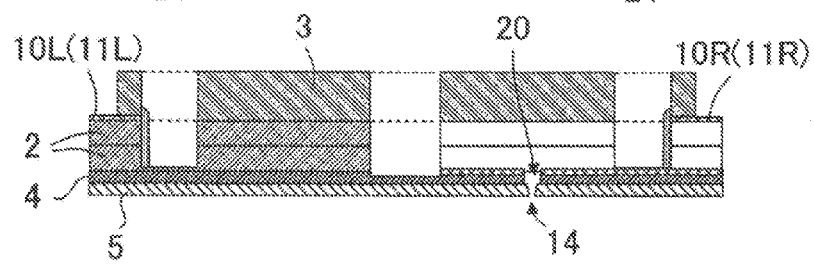
Figure 18:
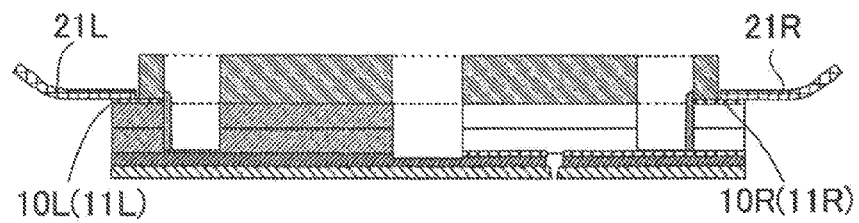

Next, in a grinding step S9, the base plate 4 is ground on the side opposite to the actuator portion 2 so that the surface is planarized as illustrated in part (S9) of FIG. 18. Next, in a sealing step S12 (omitted in FIG. 13), the grooves 18 opened to the side surfaces on the outer peripheral sides of the left and right second recessed portions 7L and 7R are sealed with the sealing member 24 made of an adhesive. This prevents liquid filled in the left and right second recessed portions 7L and 7R (not shown) from leaking to the outside. Note that, the sealing member 24 may be provided on the end portion sides of the cover plate 3.

Next, in a nozzle plate bonding step S10, as illustrated in part (S10) of FIG. 18, the nozzle plate 5 is bonded to the base plate 4 via an adhesive. The nozzle plate 5 is provided with the nozzles 14 communicated with the through holes 20. The nozzle 14 may be formed in advance before the nozzle plate 5 is bonded to the base plate 4, or may be formed at the positions of the through holes 20 after the bonding. The nozzle plate 5 may be formed with use of a polyimide film. The nozzle 14 may be perforated with use of laser light.

Next, in a flexible substrate bonding step S13 (omitted in FIG. 13), as illustrated in part (S13) of FIG. 18, the left and right flexible substrates 21L and 21R are bonded to the front surface H of the actuator portion 2 so that the wiring electrodes formed on the left and right flexible substrates 21L and 21R and the left and right electrode terminal rows 11L and 11R formed on the actuator portion 2 are electrically connected to each other, respectively, via an anisotropic conductive member (not shown).

As described above, according to the method of manufacturing the liquid jet head 1 of the present invention, the electrode terminals 10 can be formed by collective patterning by photolithography, and hence this method is simpler as compared to the conventional method of performing pattering by line drawing using laser light, and manufacturing is possible in a short period of time. Further, unlike the conventional method, it is unnecessary to establish electrical connection between the inclined portion of the trapezoidal piezoelectric material and the flat portion to which this piezoelectric material adheres. Therefore, a highly-reliable wiring pattern can be formed. Further, in the conventional method, the frame member is provided after the electrode pattern is formed, and hence highly-accurate positioning has been necessary, but in the present invention, positioning of the frame member is unnecessary. Further, in the conventional method, the surface planarizing step is necessary after the frame member is provided, but in the present invention, such a planarizing step is unnecessary, which leads to an advantage that the manufacturing is simplified.

(Eighth Embodiment)

Figure 19:
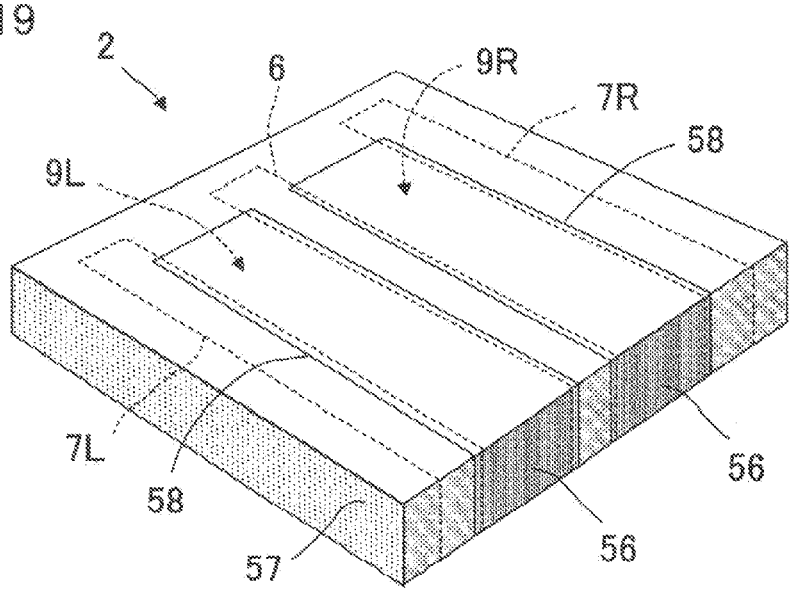
FIG. 19 is a schematic partial perspective view of an actuator portion, for illustrating a method of manufacturing a liquid jet head according to an eighth embodiment of the present invention.
Figure 20:
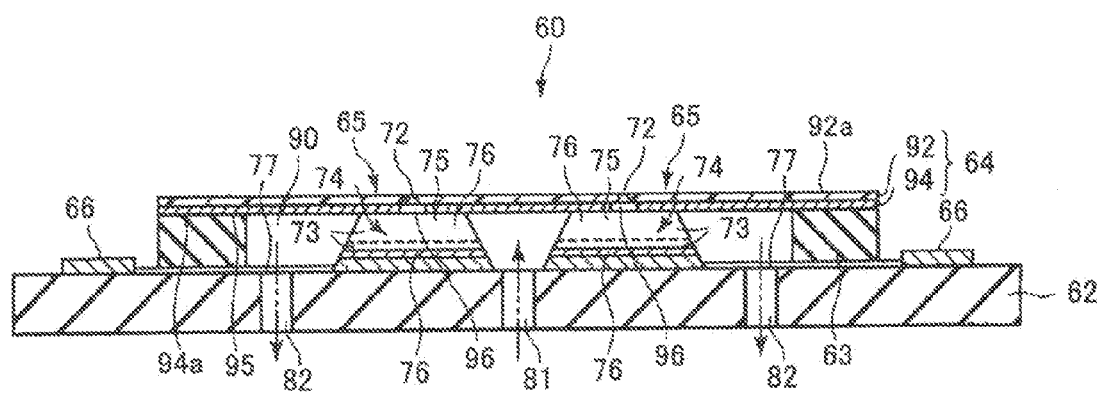
FIG. 20 is a sectional view of a conventionally-known ink jet head.

FIG. 19 is a schematic partial perspective view of the actuator portion 2, for illustrating a method of manufacturing a liquid jet head 1 according to an eighth embodiment of the present invention. In the actuator portion forming step S2, the actuator portion 2 is formed as follows. A piezoelectric substrate 56 is fitted into an insulating substrate 57 made of an insulating material having a dielectric constant smaller than that of the piezoelectric material in regions that become the left and right channel rows 9L and 9R, and then planarizing is performed. In this case, the piezoelectric substrate 56 has a laminated structure in which a piezoelectric substrate upwardly-polarized with respect to the substrate surface and a piezoelectric substrate downwardly-polarized with respect thereto are laminated.

Further, in the recessed portion forming step S6, when the first recessed portion 6 and the left and right second recessed portions 7L and 7R indicated by the broken lines are formed by grinding, a boundary plane 58 between the piezoelectric substrate 56 and the insulating substrate 57 is removed. In this manner, it is possible to reduce the usage amount of the expensive piezoelectric material and reduce the manufacturing cont. Further, the wiring electrode and the electrode terminal row are not formed on the piezoelectric substrate, and hence the capacitance between the electrodes is reduced, and thus the power consumption is significantly reduced. Note that, as the insulating substrate 57, a low-dielectric constant material such as machinable ceramics, alumina ceramics, and silicon dioxide may be used.

What is claimed is:

1. A liquid jet head, comprising:
    an actuator portion comprising:
        a first recessed portion;
        left and right second recessed portions formed at a distance from the first recessed portion and provided so as to sandwich the first recessed portion therebetween;
        left and right channel rows provided between the first recessed portion and the left and right second recessed portions, respectively, and being offset in a row direction by ½ of a channel pitch, the left and right channel rows each including a plurality of channels each having one end portion opened to the first recessed portion and another end portion opened to one of the left and right second recessed portions, the plurality of channels being formed of a plurality of grooves each sandwiched by two walls of a plurality of walls extending from the first recessed portion to one of the left and right second recessed portions, and a width of the walls corresponding to one of the left and right channel rows being equal to a width of the grooves corresponding to the other of the left and right channel rows; and
        left and right electrode terminal rows provided on a front surface on outer peripheral sides with respect to the left and right second recessed portions, respectively, the left and right electrode terminal rows each including a plurality of electrode terminals for transmitting a drive signal to the left and right channel rows, respectively;
    a cover plate including a first liquid chamber communicated with the first recessed portion and left and right second liquid chambers communicated with the left and right second recessed portions, respectively, the cover plate being bonded to the actuator portion while exposing the left and right electrode terminal rows and covering the left and right channel rows; and
    a nozzle plate including left and right nozzle rows each of which is formed of a row of nozzles communicated with the channels of the left and right channel rows, the nozzle plate being bonded to the actuator portion on a side opposite to the cover plate.

2. A liquid jet head according to claim 1, wherein the actuator portion is made of a piezoelectric material in parts between the first recessed portion and the left and right second recessed portions and is made of an insulating material having a dielectric constant smaller than a dielectric constant of the piezoelectric material in parts on outer peripheral sides with respect to the left and right second recessed portions.

3. A liquid jet head according to claim 1, wherein the left and right channel rows are each formed of an array of the plurality of grooves defined by the plurality of walls, and wherein each of the plurality of walls has a side surface on which a drive electrode is provided.

4. A liquid jet head according to claim 3, wherein corresponding ones of the plurality of electrode terminals and the drive electrode are electrically connected to each other via a wiring electrode provided on a bottom portion of the one of the left and right second recessed portions.

5. A liquid jet head according to claim 4, wherein the one of the left and right second recessed portions has a bottom surface including a protrusion which is continuous with a corresponding one of the plurality of walls and which remains when an upper part of the corresponding one of the plurality of walls is removed, and wherein the wiring electrode is formed on a side surface of the protrusion and the bottom surface between adjacent protrusions.

6. A liquid jet head according to claim 3, wherein the plurality of grooves are extended to reach outer peripheral end sides of the actuator portion with respect to the left and right second recessed portions.

7. A liquid jet head according to claim 1, further comprising left and right flexible substrates bonded to the front surface of the actuator portion on end portion sides and electrically connected to the respective left and right electrode terminal rows.

8. A liquid jet head according to claim 1, wherein a longitudinal direction of the plurality of channels is orthogonal to the row direction of the left and right channel rows.

9. A liquid jet head according to claim 1, wherein the left nozzle row and the right nozzle row are offset in the row direction by ½ of a nozzle pitch.

10. A liquid jet head according to claim 1, wherein the actuator portion has a laminated structure in which a piezoelectric material upwardly-polarized with respect to the front surface and a piezoelectric material downwardly-polarized with respect to the front surface are laminated.

11. A liquid jet head according to claim 1, wherein the plurality of channels are communicated with the nozzles via respective through-holes.

12. A liquid jet head according to claim 11, wherein the actuator portion comprises a base plate, and wherein the through holes are formed in the base plate.

13. A liquid jet apparatus, comprising:
the liquid jet head according to claim 1;
a moving mechanism for reciprocating the liquid jet head;
a liquid supply tube for supplying liquid to the liquid jet head; and
a liquid tank for supplying the liquid to the liquid supply tube.

14. A liquid jet apparatus according to claim 2, wherein the left and right channel rows are each formed of an array of the plurality of grooves defined by the plurality of walls, and wherein each of the plurality of walls has a side surface on which a drive electrode is provided.

15. A liquid jet head according to claim 2, further comprising left and right flexible substrates bonded to the front surface of the actuator portion on end portion sides and electrically connected to the respective left and right electrode terminal rows.

16. A liquid jet head according to claim 2, wherein a longitudinal direction of the plurality of channels is orthogonal to the row direction of the left and right channel rows.

17. A liquid jet head according to claim 2, wherein the left nozzle row and the right nozzle row are offset in the row direction by ½ of a nozzle pitch.

18. A liquid jet head according to claim 2, wherein the actuator portion has a laminated structure in which a piezoelectric material upwardly-polarized with respect to the front surface and a piezoelectric material downwardly-polarized with respect to the front surface are laminated.

19. A liquid jet head according to claim 2, wherein the plurality of channels are communicated with the nozzles via respective through-holes.

20. In a liquid jet head, an actuator portion comprising:
a first recessed portion;
left and right second recessed portions formed at a distance from the first recessed portion and arranged so that the first recessed portion is disposed therebetween; and
left and right channel rows provided between the first recessed portion and the left and right second recessed portions, respectively, and being offset in a row direction by ½ of a channel pitch, the left and right channel rows each including a plurality of channels each having one end portion opened to the first recessed portion and another end portion opened to one of the left and right second recessed portions, the plurality of channels being formed of a plurality of grooves each sandwiched by two walls of a plurality of walls extending from the first recessed portion to one of the left and right second recessed portions, and a width of the walls corresponding to one of the left and right channel rows being equal to a width of the grooves corresponding to the other of the left and right channel rows.

21. A liquid jet apparatus having the liquid jet head according to claim 20.

* * * * *